United States Patent
Kastrup et al.

(10) Patent No.: US 12,500,063 B2
(45) Date of Patent: Dec. 16, 2025

(54) METHOD AND APPARATUS FOR INSPECTION

(71) Applicant: ASML NETHERLANDS B.V., Veldhoven (NL)

(72) Inventors: Bernardo Kastrup, Veldhoven (NL); Johannes Catharinus Hubertus Mulkens, Valkenswaard (NL); Marinus Aart Van Den Brink, Moergestel (NL); Jozef Petrus Henricus Benschop, Veldhoven (NL); Erwin Paul Smakman, Eindhoven (NL); Tamara Druzhinina, Eindhoven (NL); Coen Adrianus Verschuren, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 18/411,525

(22) Filed: Jan. 12, 2024

(65) Prior Publication Data

US 2024/0186107 A1 Jun. 6, 2024

Related U.S. Application Data

(63) Continuation of application No. 17/403,006, filed on Aug. 16, 2021, now Pat. No. 11,875,966, which is a
(Continued)

(30) Foreign Application Priority Data

Dec. 24, 2015 (EP) ..................................... 15202676
Apr. 22, 2016 (EP) ..................................... 16166550

(51) Int. Cl.
*H01J 37/26* (2006.01)
*H01J 37/02* (2006.01)
(Continued)

(52) U.S. Cl.
CPC .......... *H01J 37/263* (2013.01); *H01J 37/023* (2013.01); *H01J 37/15* (2013.01); *H01J 37/22* (2013.01);
(Continued)

(58) Field of Classification Search
None
See application file for complete search history.

(56) References Cited

U.S. PATENT DOCUMENTS 6,145,438 A 11/2000 Berglund et al.
6,465,783 B1 * 10/2002 Nakasuji ................. H01J 37/28
250/311
(Continued)

FOREIGN PATENT DOCUMENTS

CN 101300656 11/2008
JP 2001-308154 11/2001
(Continued)

OTHER PUBLICATIONS

Search Report and Written Opinion issued for International Patent Application No. PCT/EP2016/080374, dated May 17, 2017.
(Continued)

*Primary Examiner* — Andrew Smyth
(74) *Attorney, Agent, or Firm* — Pillsbury Winthrop Shaw Pittman, LLP

(57) ABSTRACT

An electron beam inspection apparatus, the apparatus including a plurality of electron beam columns, each electron beam column configured to provide an electron beam and detect scattered or secondary electrons from an object, and an actuator system configured to move one or more of the electron beam columns relative to another one or more of the electron beam columns, the actuator system including a plurality of first movable structures at least partly overlapping a plurality of second movable structures, the first
(Continued)

and second movable structures supporting the plurality of electron beam columns.

20 Claims, 13 Drawing Sheets

Related U.S. Application Data continuation of application No. 16/064,193, filed as application No. PCT/EP2016/080374 on Dec. 9, 2016, now Pat. No. 11,094,502.

(51) Int. Cl.
    *H01J 37/15*     (2006.01)
    *H01J 37/22*     (2006.01)
    *H01J 37/244*     (2006.01)
    *H01J 37/28*     (2006.01)

(52) U.S. Cl.
    CPC ............ *H01J 37/244* (2013.01); *H01J 37/28* (2013.01); *H01J 2237/0245* (2013.01); *H01J 2237/2817* (2013.01)

(56) References Cited

U.S. PATENT DOCUMENTS

| | | | |
|---|---|---|---|
| 7,587,704 | B2 | 9/2009 | Ye et al. |
| 7,916,930 | B2 | 3/2011 | Zibold et al. |
| 7,928,404 | B2 | 4/2011 | Parker |
| 2002/0015143 | A1 | 2/2002 | Yin et al. |
| 2002/0142496 | A1 | 10/2002 | Nakasuji |
| 2004/0151991 | A1 | 8/2004 | Stewart et al. |
| 2008/0006777 | A1 | 1/2008 | Inoue |
| 2009/0157360 | A1 | 6/2009 | Ye et al. |
| 2010/0224777 | A1 | 9/2010 | Spallas |
| 2011/0276935 | A1 | 11/2011 | Fouquet |
| 2013/0136334 | A1* | 5/2013 | Sakurai ................ G01N 21/956 382/145 |
| 2015/0356233 | A1 | 12/2015 | Fouquet et al. |
| 2016/0064185 | A1* | 3/2016 | Werder ................ G06T 7/0004 250/307 |

FOREIGN PATENT DOCUMENTS

| | | | |
|---|---|---|---|
| JP | 2005071747 A | * | 3/2005 |
| TW | 201403652 | | 1/2014 |
| TW | 201546860 | | 12/2015 |

OTHER PUBLICATIONS

Meisburger, Dan, et al: "Proposed architecture of a multi-column electron-beam wafer inspection system for high-volume manufacturing", Journal of Vacuum Science & Technology B 33(6), Nov. 2015, 15 pages.
Notice of Reasons for Refusal dated Jun. 20, 2019, issued in corresponding Japanese Patent Application No. 2018-532672 with English translation.
Chinese Office Action dated Apr. 2, 2020, issued in corresponding Chinese Patent Application No. 201680082561.8 with English translation.
Chinese Office Action dated Jul. 2, 2019, issued in corresponding Chinese Patent Application No. 201680082561.8.

* cited by examiner

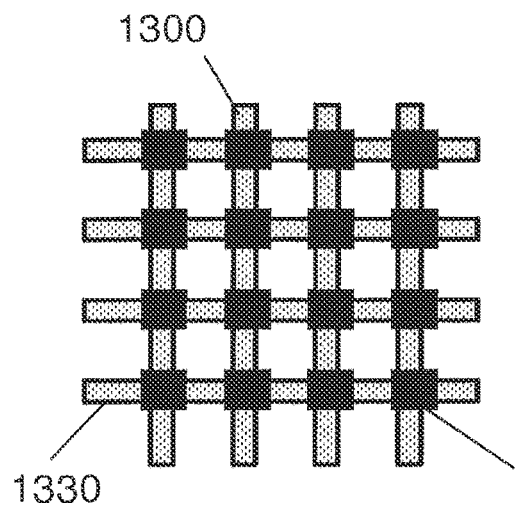
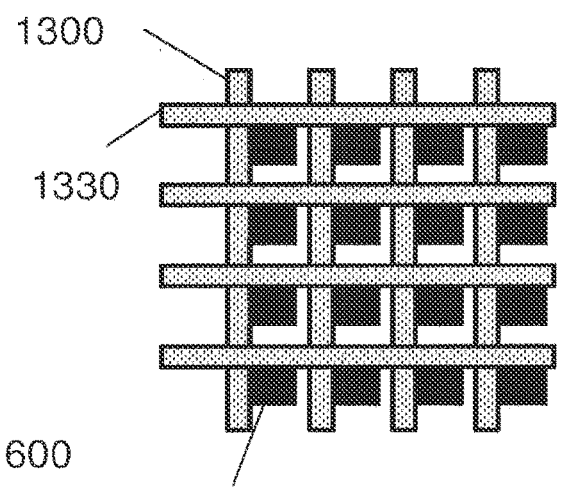
Fig. 16A    Fig. 16B
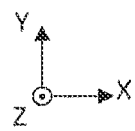
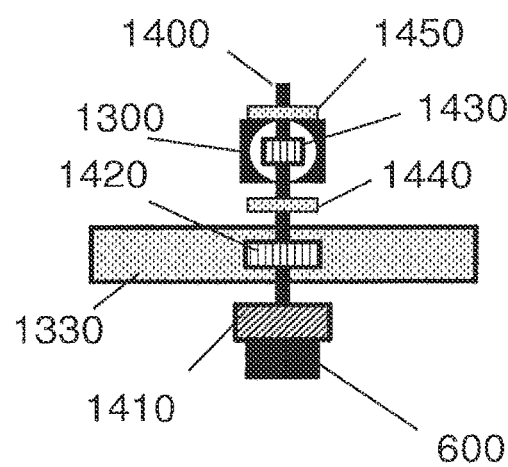
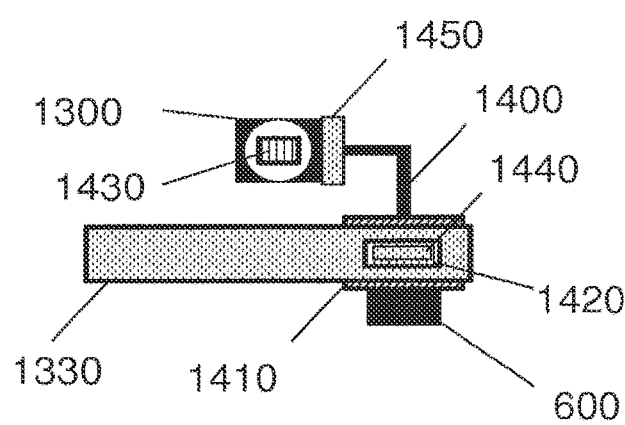
Fig. 17A    Fig. 17B
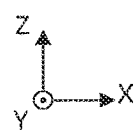

METHOD AND APPARATUS FOR INSPECTION

This application is a continuation of U.S. patent application Ser. No. 17/403,006, filed Aug. 16, 2021, now allowed, which is a continuation of U.S. patent application Ser. No. 16/064,193, filed on Jun. 20, 2018, now U.S. Pat. No. 11,094,502, which is the U.S. national phase entry of PCT Patent Application No. PCT/EP2016/080374, filed on Dec. 9, 2016, which claims the benefit of priority of European Patent Application No. 15202676.1, filed on Dec. 24, 2015, and of European Patent Application No. 16166550.0, filed on Apr. 22, 2016, each of the foregoing applications is incorporated herein in its entirety by reference.

FIELD

The present description relates to methods and apparatus for inspection.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes are typically involved in the patterning process.

Metrology processes are used at various stages of a patterning process to set up, monitor and/or control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, and/or of a patterning device (e.g., a reticle), such as relative location (e.g., registration error) or dimension (e.g., line width, critical dimension (CD), etc.) Using the one or more characteristics, the setup, performance, etc. of the patterning process can be determined. If the one or more characteristics are unacceptable (e.g., out of a predetermined range for the characteristic(s)), the measurements of the one or more characteristics may be used to alter one or more parameters of the patterning process such that substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. Errors, such as overlay errors, CD errors, registration errors, etc., will inevitably be produced as part of the overall patterning process. For example, imaging errors may be produced from optical aberration, patterning device heating, patterning device errors, and/or substrate heating and can be characterized in terms of, e.g., overlay errors, CD errors, etc. Additionally or alternatively, errors may be introduced in other parts of the patterning process, such as in the patterning device, by an etch process, by a development process, by a bake process, etc. and similarly can be characterized in terms of parameters such as registration error, overlay error, CD error, etc. The errors may directly cause a problem in terms of the function of the device, including failure of the device to function or one or more electrical problems of the functioning device.

As noted above, in patterning processes, it is desirable to frequently make measurements of the structures used or created, e.g., for process control and verification. One or more parameters of the structures are typically measured or determined, for example the critical dimension of a structure, the overlay error between successive layers formed in or on a substrate, etc. There are various techniques for making measurements of the microscopic structures used or formed in a patterning process. Various tools for making such measurements are known including, but not limited to, scanning electron microscopes (SEMs), which are often used to measure critical dimension (CD). SEMs have high resolving power and are capable of resolving features of the order of 30 nm or less, 20 nm or less, 10 nm or less, or 5 nm or less. SEM images of semiconductor devices are often used in the semiconductor fab to observe what is happening at the device level.

The information contained in SEM images of structures can be used for process modeling, existing model calibration (including recalibration), defect detection, estimation, characterization or classification, yield estimation, process control or monitoring, etc. Such SEM images may be processed to extract contours that describe the edges of objects, representing device structures (whether on a patterning device or formed on a substrate), in the image. These contours are then quantified via metrics, such as CD, at user-defined cut-lines. Thus, typically, the images of device structures are compared and quantified via metrics, such as an edge-to-edge distance (CD) measured on extracted contours or simple pixel differences between images.

In an embodiment, there is provided an electron beam inspection apparatus to inspect an object comprising a plurality of dies or fields, the apparatus comprising: a plurality of electron beam columns, each electron beam column configured to provide an electron beam and detect scattered or secondary electrons from the object, each electron beam column arranged to inspect a different respective field or die associated with the electron beam column; and a non-transitory computer program product comprising machine-readable instructions, at least some of the instructions configured to cause relative movement between the object and the electron beam columns such that each of the electron beams inspects an area of its respective field or die less than the entire area of the respective field or die.

In an embodiment, there is provided an electron beam inspection apparatus, comprising: a plurality of electron beam columns, each electron beam column configured to provide an electron beam and detect scattered or secondary electrons from the object, each electron beam column arranged to inspect an area of a different respective field or die associated with the electron beam column; and an actuator system configured to move one or more of the electron beam columns relative to another one or more of the electron beam columns.

In an embodiment, there is provided a method of electron beam inspection of an object comprising a plurality of dies or fields, the method comprising: having a plurality of electron beam columns, each electron beam column configured to provide an electron beam and detect scattered or secondary electrons from the object and each electron beam column arranged to inspect a different respective field or die associated with the electron beam column; causing relative movement between the object and the plurality of electron beam columns such that each of the electron beams inspects an area of its respective field or die less than the entire area of the respective field or die; providing the electron beams onto the object from the electron beam columns; and detecting scattered or secondary electrons from the object using the electron beam columns.

In an embodiment, there is provided a method of electron beam inspection, the method comprising: having a plurality of electron beam columns, each electron beam column configured to provide an electron beam and detect scattered or secondary electrons from an object and each electron beam column arranged to inspect an area of a different respective field or die associated with the electron beam column; and moving one or more of the electron beam columns relative to another one or more of the electron beam columns using an actuator system.

In an aspect, there is provided a method of manufacturing devices wherein a device pattern is applied to a series of substrates using a patterning process, the method including evaluating a patterned structure formed using the patterning process using a method described herein and controlling the patterning process for one or more of the substrates in accordance with the result of the method. In an embodiment, the patterned structure is formed on at least one of the substrates and the method comprises controlling the patterning process for later substrates in accordance with the result of the method.

In aspect, there is provided a non-transitory computer program product comprising machine-readable instructions configured to cause a processor to cause performance of a method described herein.

In an aspect, there is provided an electron beam inspection system. The system includes an electron beam inspection apparatus as described herein; and an analysis engine comprising a non-transitory computer program product as described herein. In an embodiment, the system further comprises a lithographic apparatus comprising a support structure configured to hold a patterning device to modulate a radiation beam and a projection optical system arranged to project the modulated radiation beam onto a radiation-sensitive substrate.

In an embodiment, there is provided an electron beam inspection apparatus, the apparatus comprising: a plurality of electron beam columns, each electron beam column configured to provide an electron beam and detect scattered or secondary electrons from an object; and an actuator system configured to move one or more of the electron beam columns relative to another one or more of the electron beam columns, the actuator system comprising a plurality of first movable structures at least partly overlapping a plurality of second movable structures, the first and second movable structures supporting the plurality of electron beam columns.

In an embodiment, there is provided a method of electron beam inspection, the method comprising: having a plurality of electron beam columns, each electron beam column configured to provide an electron beam and detect scattered or secondary electrons from an object; moving one or more of the electron beam columns relative to another one or more of the electron beam columns using an actuator system, the actuator system comprising a plurality of first movable structures at least partly overlapping a plurality of second movable structures, the first and second movable structures supporting the plurality of electron beam columns; providing the electron beams onto the object from the electron beam columns; and detecting scattered or secondary electrons from the object using the electron beam columns.

In an embodiment, there is provided a patterning device repair apparatus, comprising: a plurality of beam columns, each beam column configured to provide a beam of radiation, each beam column arranged to repair an area of a different respective field or die of a patterning device associated with the beam column using the respective beam of radiation; and an actuator system configured to move one or more of the beam columns relative to another one or more of the beam columns.

BRIEF DESCRIPTION OF THE DRAWINGS

Embodiments will now be described, by way of example only, with reference to the accompanying drawings in which:

FIGS. 16A and 16B schematically depict a top or bottom view of an embodiment of a multi-column electron beam apparatus; and FIGS. 17A and 17B schematically depict a side view of an embodiment of a column of a multi-column electron beam apparatus.

DETAILED DESCRIPTION

Before describing embodiments in detail, it is instructive to present an example environment in which embodiments may be implemented.

Figure 1:
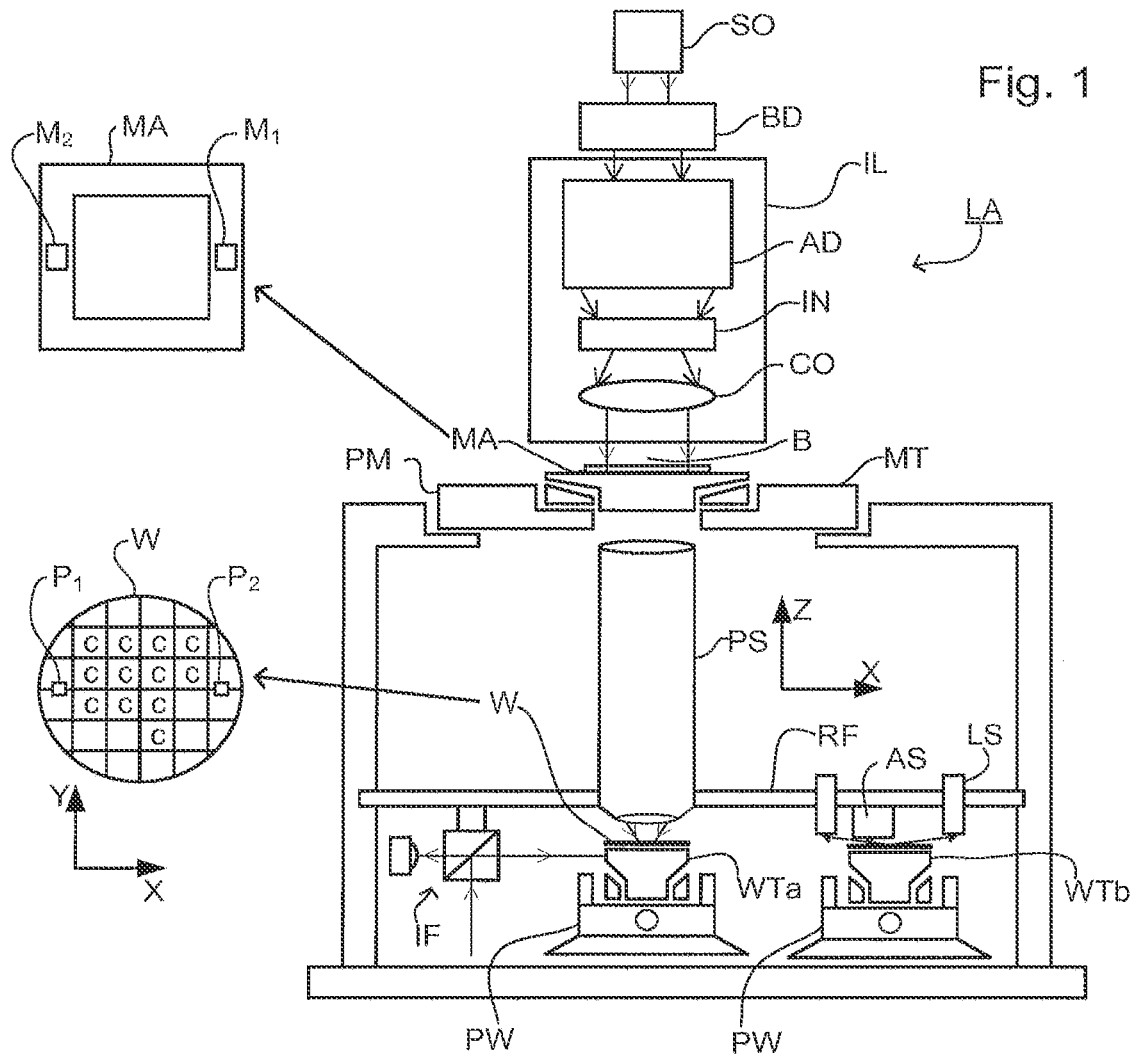
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for pattern transfer.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different patterning or other process conditions than adjacent features. An embodiment of an alignment system, which detects the alignment markers, is described further below.

The depicted apparatus could be used in at least one of the following modes:

In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
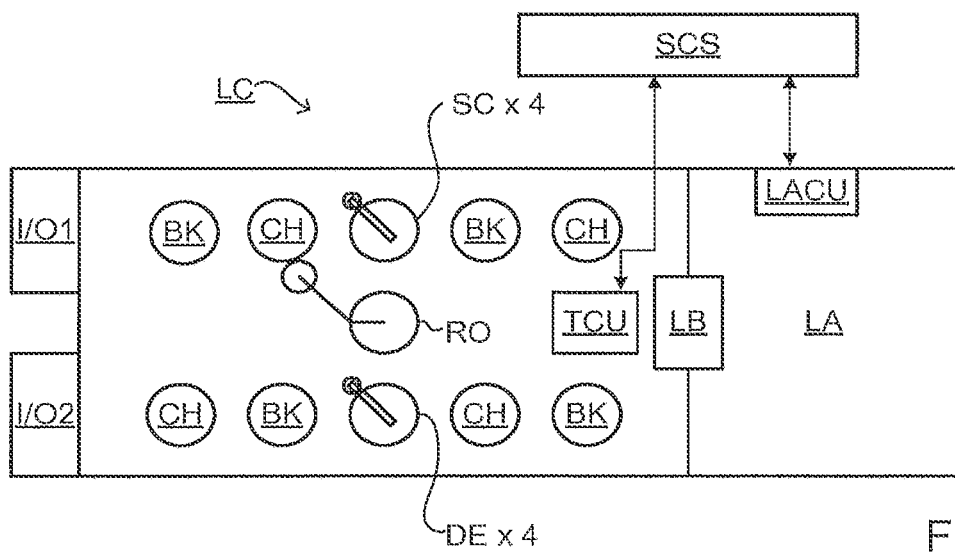
FIG. 2 schematically depicts an embodiment of a lithographic cell or cluster.

As shown in FIG. 2, a lithographic apparatus LA may form part of a lithographic cell LC, also sometimes referred to as a lithocell or lithocluster, which also includes apparatus to perform one or more pre- and post-pattern transfer processes on a substrate. Conventionally these include one or more spin coaters SC to deposit a resist layer, one or more developers DE to develop patterned resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

Figure 13:
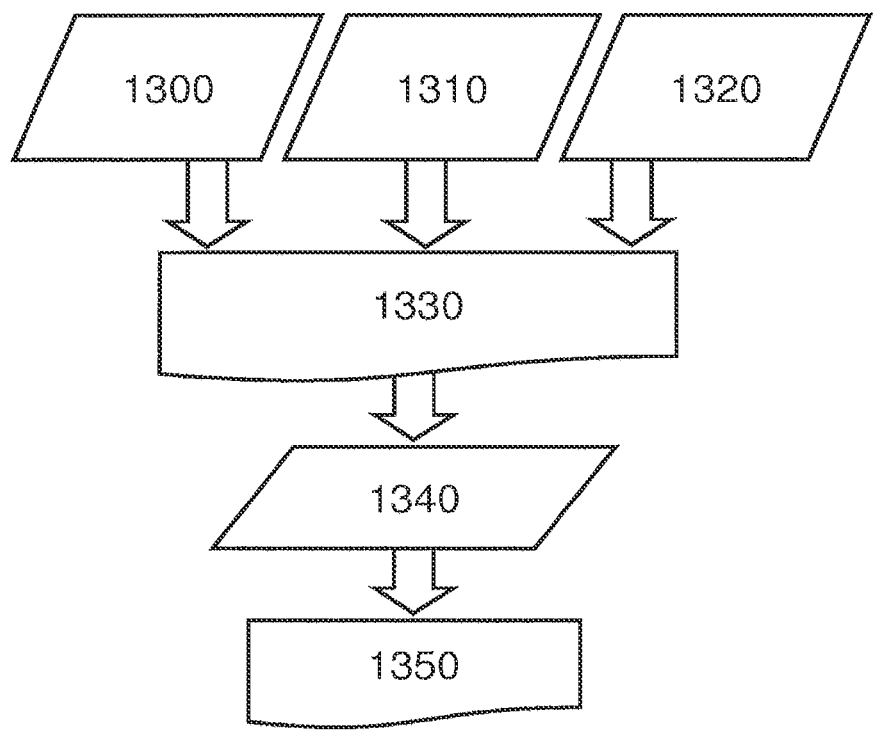
FIG. 13 depicts an example flow chart for modeling and/or simulating lithography in a lithographic projection apparatus.

Further, it is often desirable to model the patterning process so that, for example, the patterning process can be designed, controlled, monitored, etc. Thus, one or more mathematical models can be provided that describe one or more steps of the patterning process, including typically the pattern transfer step. In an embodiment, a simulation of the patterning process can be performed using one or more mathematical models to simulate how the patterning process forms a patterned substrate using a measured or design pattern provided by a patterning device. An exemplary flow chart for modeling and/or simulating lithography in a lithographic projection apparatus is illustrated in FIG. 13. As will be appreciated, the models may represent a different patterning process and need not comprise all the models described below. A source model 1300 represents optical characteristics (including radiation intensity distribution, bandwidth and/or phase distribution) of the illumination of a patterning device. The source model 1300 can represent the optical characteristics of the illumination that include, but not limited to, numerical aperture settings, illumination sigma (σ) settings as well as any particular illumination shape (e.g. off-axis radiation shape such as annular, quadrupole, dipole, etc.). A projection optics model 1310 represents optical characteristics (including changes to the radiation intensity distribution and/or the phase distribution caused by the projection optics) of the projection optics. The projection optics model 1310 can represent the optical characteristics of the projection optics, including aberration, distortion, one or more refractive indexes, one or more physical sizes, one or more physical dimensions, etc. A design layout model 1320 represents optical characteristics (including changes to the radiation intensity distribution and/or the phase distribution caused by a given design layout) of a design layout, which is the representation of an arrangement of features on or formed by the patterning device. The design layout model 1320 can represent one or more physical properties of a physical patterning device, as described, for example, in U.S. Pat. No. 7,587,704, which is incorporated by reference in its entirety. Since the patterning device used in the lithographic projection apparatus can be changed, it is desirable to separate the optical properties of the patterning device from the optical properties of the rest of the lithographic projection apparatus including at least the illumination and the projection optics.

An aerial image 1330 can be simulated from the source model 1300, the projection optics model 1310 and the design layout model 1320. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 1350 can be simulated from the aerial image 1330 using a resist model 1340. The resist model can be used to calculate the resist image from the aerial image, an example of which can be found in U.S. Patent Application Publication No. US 2009-0157360, the disclosure of which is hereby incorporated by reference in its entirety. The resist model is typically related only to properties of the resist layer (e.g., effects of chemical processes which occur during exposure, post-exposure bake and development).

Simulation of the lithography can, for example, predict contours and/or CDs in the resist image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

From the design layout, one or more portions may be identified, which are referred to as "clips". In an embodiment, a set of clips is extracted, which represents the complicated patterns in the design layout (e.g., about 500 to 800,000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns. Those clips that are predicted as having a defect when printed are referred to as hotspots.

An initial larger set of clips may be provided, e.g., a priori by a customer based on one or more known critical feature areas in a design layout which require particular attention. Alternatively, in another embodiment, an initial larger set of clips may be extracted from the entire design layout by using some kind of automated (such as machine vision) or manual algorithm that identifies the one or more critical feature areas.

Further, in order that the substrate that is processed (e.g., exposed) by the lithographic apparatus is processed correctly and consistently, it is desirable to inspect a processed substrate to measure one or more properties such as overlay error between subsequent layers, line thickness, critical dimension (CD), etc. If an error is detected, an adjustment may be made to processing of one or more subsequent substrates. This may be particularly useful, for example, if the inspection can be done soon and fast enough that another substrate of the same batch is still to be processed. Also, an already processed substrate may be stripped and reworked (to improve yield) or discarded, thereby avoiding performing a pattern transfer on a substrate that is known to be faulty. In a case where only some target portions of a substrate are faulty, a further pattern transfer may be performed only on those target portions which are good. Another possibility is to adapt a setting of a subsequent process step to compensate for the error, e.g. the time of a trim etch step can be adjusted to compensate for substrate-to-substrate CD variation resulting from a lithographic process step.

In a similar manner, a patterning device (e.g., a reticle) can be inspected to determine whether there are any errors in the pattern on the patterning device. Such inspection can determine a registration error (e.g., a difference in placement between a portion of a pattern as "written" on a patterning device as compared to the designed placement) and/or dimension (e.g., feature width, feature length, etc.) of a feature of the pattern on the patterning device.

An inspection apparatus is used to determine one or more properties of a substrate, and in particular, how one or more properties of different substrates or different layers of the same substrate vary from layer to layer and/or across a substrate and/or across different substrates, e.g., from substrate to substrate. The inspection apparatus may be integrated into the lithographic apparatus LA or the lithocell LC or may be a stand-alone device. To enable most rapid measurements, it is desirable that the inspection apparatus measure one or more properties in the patterned resist layer immediately after pattern transfer. However, the latent pattern in the resist may have a very low contrast—e.g., there is only a very small difference in refractive index between the part of the resist which has been exposed to radiation and that which has not—and not all inspection apparatuses have sufficient sensitivity to make useful measurements of the latent pattern. Therefore measurements may be taken after a post-exposure bake step (PEB) which is customarily the first step carried out on a patterned substrate and increases the contrast between, e.g., exposed and unexposed parts of the resist. At this stage, the pattern in the resist may be referred to as semi-latent. It is also possible to make measurements of the developed resist image—at which point, e.g., either the exposed or unexposed parts of the resist have been removed—or after a pattern transfer step such as etching. The latter possibility limits the possibility for rework of a faulty substrate but may still provide useful information, e.g. for the purpose of process control.

Inspection apparatus to determine one or more properties of an object (such as a semiconductor substrate, patterning device, etc.) can take various different forms. For example, the inspection apparatus may use photon electromagnetic radiation to illuminate the object and detect radiation redirected by the object; such inspection apparatuses may be referred to as bright-field inspection apparatuses. A bright-field inspection apparatus may use radiation with a wavelength in, for example, the range of 150-900 nm. The inspection apparatus may be image-based, i.e., taking an image of the object, and/or diffraction-based, i.e., measuring intensity of diffracted radiation. The inspection apparatus may inspect product features (e.g., features of an integrated circuit to be formed using a substrate or features of a mask) and/or inspect specific measurement targets (e.g., overlay targets, focus/dose targets, CD gauge patterns, etc.).

Inspection of, e.g., semiconductor wafers is done mostly with optics-based sub-resolution tools (bright-field inspection). But, in some cases, certain features to be measured are too small to be effectively measured using bright-field inspection. For example, bright-field inspection of defects in features of a semiconductor device can be challenging. Moreover, as time progresses, features that are being made using patterning processes (e.g., semiconductor features made using lithography) are becoming smaller and in many cases, the density of features is also increasing. So, future semiconductor nodes challenge the scalability of current optical inspection for measuring small defects (e.g., pattern shape defects, electrical defects, etc.) and to measure the smaller and/or denser features of those nodes, due to the resolution limits of bright-field inspection. Further, bright-field inspection can have relatively lower capture rate and/or, for a given capture rate, an increasing nuisance rate, which can lead to increased time and costs spent using bright-field inspection.

Accordingly, a higher resolution inspection technique is used and desired. An example inspection technique is electron beam inspection. Electron beam inspection involves focusing a beam of electrons on a small spot on the object to be inspected. An image is formed by providing relative movement between the beam and the object (hereinafter referred to as scanning the electron beam) over the area of the object inspected and collecting secondary and/or back-scattered electrons with an electron detector. The image data is then processed to, for example, identify defects.

Figure 3:
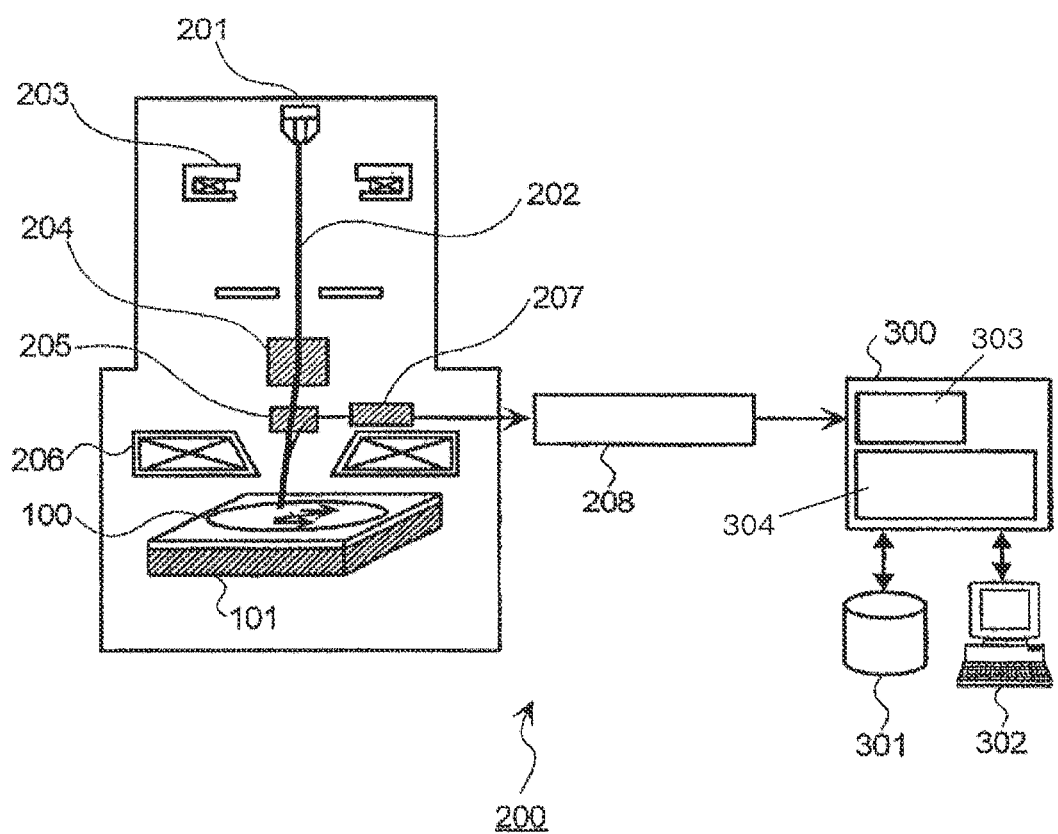
FIG. 3 schematically depicts an embodiment of a scanning electron microscope (SEM)

So, in an embodiment, the inspection apparatus may be an electron beam inspection apparatus (e.g., the same as or similar to a scanning electron microscope (SEM)) that yields an image of a structure (e.g., some or all the structure of a device, such as an integrated circuit) on the object. FIG. 3 depicts an embodiment of an electron beam inspection apparatus 200. A primary electron beam 202 emitted from an electron source 201 is converged by condenser lens 203 and then passes through a beam deflector 204, an E×B deflector 205, and an objective lens 206 to irradiate an object 100 on a table 101 at a focus.

When the object 100 is irradiated with electron beam 202, secondary electrons are generated from the object 100. The secondary electrons are deflected, e.g. by an E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the object 100 by the table 101 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 204 can provide the electron beam 202). Thus, the spatial extent of the field of the view is the spatial extent to which the angular range of the electron beam can impinge on a surface (wherein the surface can be stationary or can move with respect to the field).

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software) is configured to convert or process the digital images into datasets representative of the digital images. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

The apparatus depicted in FIG. 3 is an example of a single electron beam column inspection system; it has a single electron beam column that produces, controls and detects a single electron beam. But a single electron beam column inspection system can take a long time to inspect an object, such as a standard 300 mm wafer. This can be further exacerbated by the desire to measure smaller defects and/or features, which require a smaller beam size. Using smaller beam or pixel sizes to detect smaller defects and/or features may lead to noise and loss in throughput (e.g., due to reducing the electron current to limit any damage to the object). Increased electron current can increase throughput but has repercussions on resolution.

Thus, a single electron beam column inspection system can be significantly constrained in terms of throughput (e.g., inspection area per unit time) and is currently too slow for high-volume manufacturing. For example, there could be a throughput gap between a single electron beam column inspection system and bright-field inspection of about ~3-4 orders of magnitude. Thus, there is a desire to provide high resolution inspection with high throughput. In an embodiment, there is provided electron beam-based inspection with throughput comparable to bright-field based inspection.

In an embodiment, throughput can be increased by providing a plurality of electron beams from a particular electron beam column (hereinafter referred to as multi-beam column). Thus, the field of view of the electron beam inspection apparatus can be extended by adding multiple beams side by side in an array/matrix to create an effective field of view that is a multiple of the individual fields of view of individual beams. For example, beams can be provided with a pitch of 10 microns forming, e.g., a 10×10 matrix of beams (each with a 10×10 microns field of view at the object) with a combined field of view of 100×100 microns. This array of beams can then scan an object 100 times faster than a single beam with a field of view of 10×10 microns. But even such a gain may not be enough.

Figure 4:
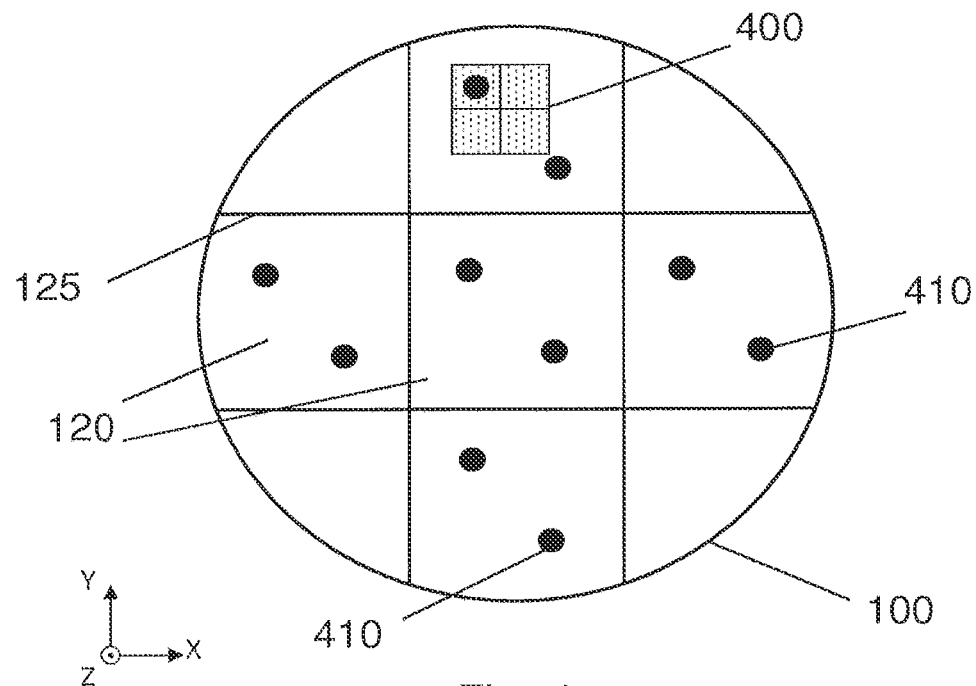
FIG. 4 schematically depicts an embodiment of multi-beam electron beam processing of an object.

Referring to FIG. 4, an example of an implementation of the multiple beams of a multi-beam column electron beam inspection system in the context of an object 100 (e.g., a semiconductor wafer, a reticle, etc.). In this case, the object 100 comprises a plurality of fields or dies 120 identified by their respective boundaries 125 (which boundaries may not be physically present on the object but rather be "imaginary" boundaries). In an embodiment, a die corresponds to a portion of an object that becomes an individual device. That is, where the object is a semiconductor wafer, the object is cut into pieces corresponding to the dies, each die becoming, e.g., a semiconductor device. In an embodiment, a field corresponds to the size of the exposure field of a lithographic apparatus used to pattern a substrate. A field may comprise plurality of dies, where, e.g., the patterning device provides a pattern comprising a plurality of dies. The object in FIG. 4 is highly schematic and will typically have many more dies/fields than shown. While a round object is depicted, it could be a different shape. The width (e.g., diameter) of the object can vary. For example, the width may be 300 nm or 450 nm. In an embodiment, an object will have about 30 or more die/fields, about 40 or more die/fields, about 50 or more die/fields, about 60 or more die/fields, about 70 or more die/fields, about 80 or more die/fields, about 90 or more die/fields, about 100 or more die/fields, about 110 or more die/fields, about 120 or more die/fields, about 130 or more die/fields, about 140 or more die/fields, about 150 or more die/fields, about 160 or more die/fields, about 170 or more die/fields, about 180 or more die/fields, about 190 or more die/fields, about 200 or more die/fields, about 220 or more die/fields, about 240 or more die/fields, or about 260 or more die/fields.

As shown in FIG. 4, the multiple beams present a combined field of view 400 in which the beams inspect the object 100. In this example, there are four beams, each with its own field of view of the combined field of view and which respective fields of view need not be equal. In this case, each beam has an equal field of view, as represented by the four segments in FIG. 4, of the combined field of view 400. Thus, in an embodiment, there is provided relative movement between the combined field of view 400 and the object 100, in order that the beams can inspect different portions (e.g., fields/dies 120 or portions thereof) of the object, including defects 410. In an embodiment, if each of the beams has a width corresponding to its respective field of view of the combined field of view 400, then the beams could be in a generally fixed orientation and the object is moved relative to the beams to inspect the object. Further, in an embodiment, there is a relative movement between an electron beam and the object to provide scanning of the beam with its respective field of view within the combined field of view 400. In an embodiment, the object is in a generally fixed orientation and the beams are moved (e.g., tilted) relative to the object to cause scanning of the beams within their respective fields of view. In an embodiment, there may be a combined movement of the beams and the object to cause scanning of the beams with their respective fields of view. So, in an embodiment, by relative movement between the combined field of view 400 and the object, the plurality of beams can be provided to different parts of the object, such as the plurality of fields/dies 120 or portions thereof, and once at a part of the object, relative movement is provided between the electron beams and the object to provide scanning of the beams with their respective fields of the combined field of view 400, to image the object, including the defects 410.

The combined field of view 400, and the individual field of view portions thereof corresponding to the respective beams, can have different shapes than as shown in FIG. 4. As noted above, in an embodiment, the boundary of each beam spot is co-extensive with its portion of the field of view 400. In an embodiment, the beam spot is smaller than the beam's portion of the field of view and thus effectively relative motion is provided between the beam and its portion of field of view 400 so that the beam can inspect the region corresponding to its portion of the field of view. In such an embodiment, the beams may be caused to move (e.g., tilt) in order to provide the relative movement between the beam and its portion of the field of view 400 and the object may be caused to move to provide the relative movement between the field of view 400 and the object. A different combination of movements may be provided as appropriate.

In an embodiment, throughput and/or the ability to measure smaller features can be improved by providing a plurality of electron beam columns, each of which provides at least a single electron beam (hereinafter referred to as a multi-column system). That is, each column provides at least a single electron beam (in an embodiment, one or more of the plurality electron beam columns is a multi-beam column) and has a detector to measure secondary and/or backscattered electrons arising from the column's electron beam being incident on the object. In an embodiment, each of the electron beam columns, or a plurality of electron beams selected from the electron beam columns, inspects the object in parallel with one or more other electron beam columns. So, in an embodiment, each beam may have a relatively small current for better resolution, but in total, the multiple electron beam columns provide a relatively high total current to enable faster inspection. Further, acquisition of images in parallel through the use of a plurality of electron beam columns enables a significant increase in throughput compared to a single electron beam column.

Figure 5:
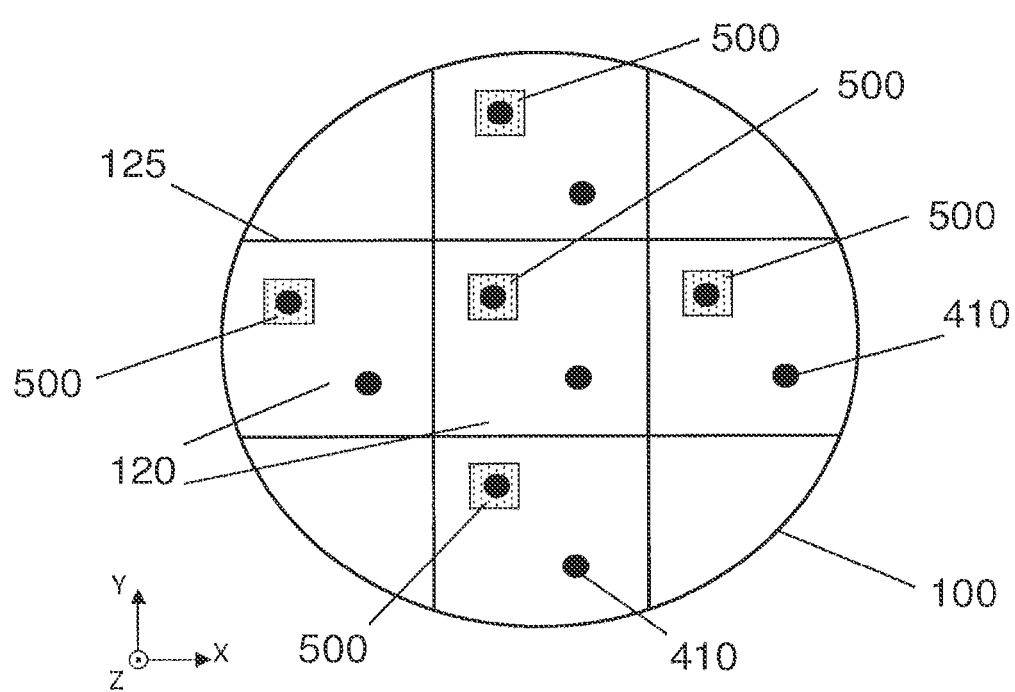
FIG. 5 schematically depicts an embodiment of multi-column electron beam processing of an object.

Referring to FIG. 5, a highly schematic example is shown of an implementation of the multiple beams of an embodiment of a multi-column electron beam inspection system in the context of an object 100. In this case, the object 100 comprises a plurality of fields or dies 120 identified by their respective boundaries 125 (which boundaries may not be physically present on the object but rather be "imaginary" boundaries). In an embodiment, each of the fields or dies has an electron beam column allocated to it. In an embodiment, each set of a plurality of sets, each set comprising a plurality of fields or dies, has an electron beam column allocated to it. In an embodiment, the plurality of electron beam columns is provided in a one dimensional array, desirably a one-dimensional array with enough electron beam columns to extend across the widest portion of the object. In an embodiment, the one dimensional array effectively scans across the object through relative movement between the array and the object in a direction orthogonal to the direction of elongation of the array. In an embodiment, the electron beam columns are arranged in a two-dimensional array. In an embodiment, the two-dimensional array extends across the width/length of the object in a first direction and across the width/length of the object in a second direction orthogonal to the first direction. In an embodiment, the two-dimensional array is a rectangular array. In an embodiment, two-dimensional array has a shape matching the shape of the object. So, for a round object, the array may be a rectangular array with array elements at the corners removed to make a generally circular array or may be diamond-shaped.

In an embodiment, an object will have about 30 or more electron beam columns allocated to the object, about 40 or more electron beam columns allocated to the object, about 50 or more electron beam columns allocated to the object, about 60 or more electron beam columns allocated to the object, about 70 or more electron beam columns allocated to the object, about 80 or more electron beam columns allocated to the object, about 90 or more electron beam columns allocated to the object, about 100 or more electron beam columns allocated to the object, about 110 or more electron beam columns allocated to the object, about 120 or more electron beam columns allocated to the object, about 130 or more electron beam columns allocated to the object, about 140 or more electron beam columns allocated to the object, about 150 or more electron beam columns allocated to the object, about 160 or more electron beam columns allocated to the object, about 170 or more electron beam columns allocated to the object, about 180 or more electron beam columns allocated to the object, about 190 or more electron beam columns allocated to the object, about 200 or more electron beam columns allocated to the object, about 220 or more electron beam columns allocated to the object, about 240 or more electron beam columns allocated to the object, or about 260 or more electron beam columns allocated to the object. The object in FIG. 5 is highly schematic and will typically have many more dies/fields than shown. While a round object is depicted, it could be a different shape. The width (e.g., diameter) of the object can vary.

As shown in FIG. 5, each beam of the plurality of beams has a respective field of view 500 in which the beam inspects the object 100. In this example, there are five beams, each with its own field of view 500. Thus, in an embodiment, there is provided relative movement between the beams and the object, which effectively causes relative movement between the fields of view 500 and the object 100, in order that the beams inspect different parts of the object, including defects 410. In an embodiment, each of the fields of view 500 is effectively dedicated to a respective field or die. That is, in an embodiment, the majority of a die or field is inspected with only a single field of view 500 of the plurality of fields of view 500. In an embodiment, each field of view 500 for a die or field inspects less than a majority, including none, of an adjacent die or field. In an embodiment, a field of view 500 does not inspect a die or field other than the one to which the field of view 500 is associated.

Thus, in an embodiment, there is provided relative movement between the fields of view 500 and the object 100 such that each field of view 500 inspects different portions of its associated die or field. In an embodiment, the fields of view 500 are in generally fixed orientation and the object is moved relative to the fields of view 500 to place the fields of view 500 at their respective portions of their respective fields or dies.

Once each of the fields of view 500 is located at its respective part of its respective die or field, each of the respective beams then inspects its respective part of its die or field in parallel with the other beams. In an embodiment, where a field of view 500 corresponds to the size of the electron beam spot, the beam is in a generally fixed orientation and the object is moved relative to the beam to cause scanning of the beam in the respective field or die. More typically, in an embodiment, the object is in a generally fixed orientation and the respective beams are moved (e.g., tilted) relative to the object to cause scanning of the beams within their respective fields of view in the respective field or die. In an embodiment, there may be a combined movement of the beams and the object to cause scanning of the beams.

So, in an embodiment, through relative movement between the fields of view 500 and the object 100, each of the beams (which operate in the field of view 500) are respectively stepped to different parts of its respective field/die 120 to image those different parts (typically through scanning of the respective beams by movement of the beam and/or of the object), including actual or suspected defects 410. Moreover, to enable throughput improvement, the parts of the different fields/dies 120 are inspected in parallel by the beams in their respective fields of view 500, i.e., a plurality of beams are projected at the object at a same to such that each beam inspects its respective field or die.

In an embodiment, the fields of view 500 that correspond to respective beams can have different shapes than as shown in FIG. 4. In an embodiment, the boundary of each beam spot is co-extensive with its field of view 500. In an embodiment, the beam spot is smaller than the beam's field of view and thus effectively relative motion is provided between the beam and its field of view 500 so that the beam can inspect the region corresponding to the field of view 500. In such an embodiment, the beams may be caused to move (e.g., tilt) in order to provide the relative movement between the beam and its field of view and the object may be caused to move to provide the relative movement between the fields of view 500 and the object. A different combination of movements may be provided as appropriate.

Figure 6:
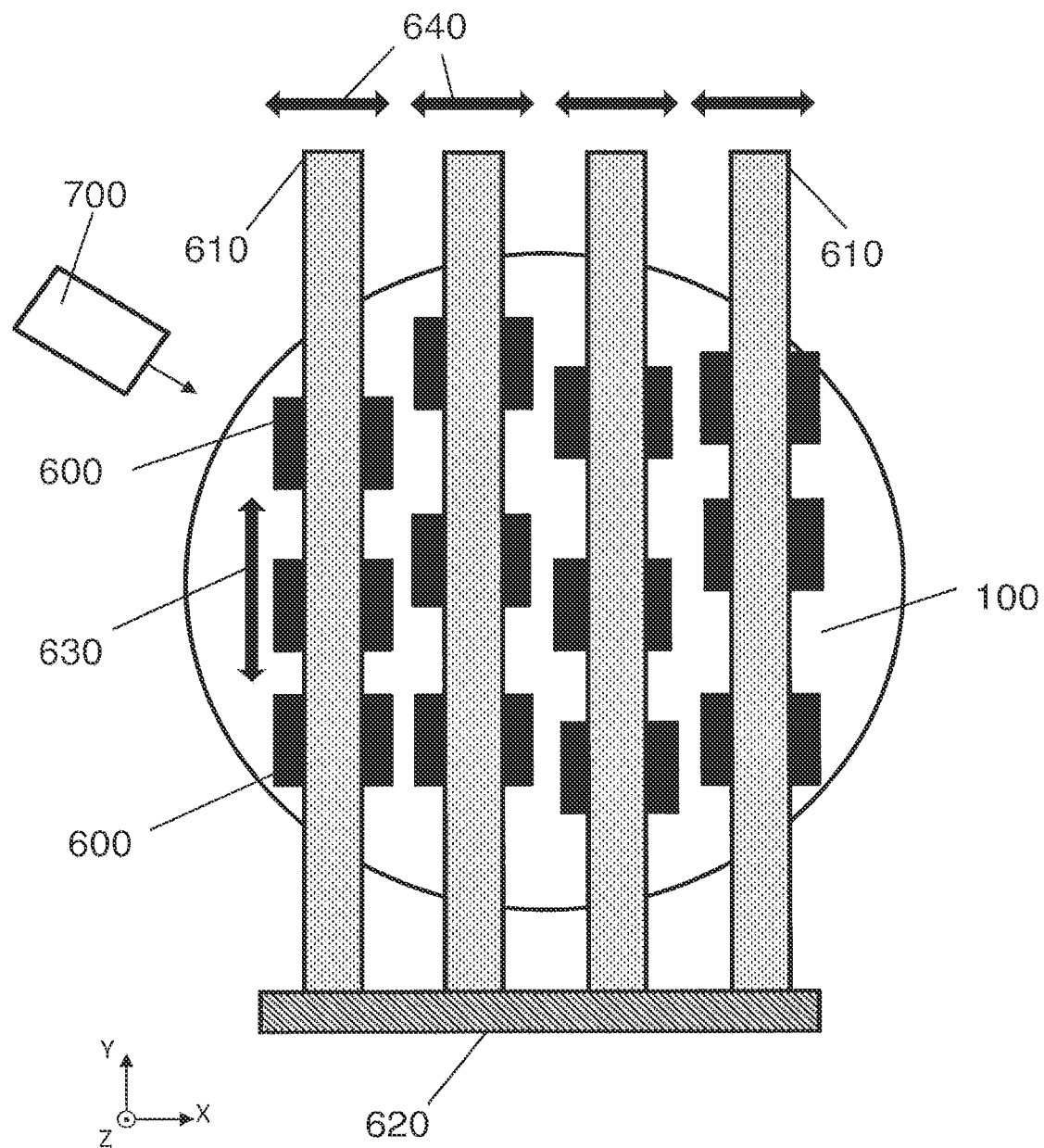
FIG. 6 schematically depicts a top or bottom view of an embodiment of a multi-column electron beam apparatus.

FIG. 6 is a highly schematic representation of an embodiment of a multi-column electron beam inspection system comprising an array of electron beam columns 600, each electron beam column corresponding to at least one die or field on object 100. Thus, in an embodiment, a plurality of miniature electron beam columns is arranged in an array (e.g., a substantially horizontal array)—in this case, a two-dimensional array. For example, 30, 40, 50, 60, 70, 80, 90, 100, 110, 120, 130, 140, 150, or 160 or more optical columns may be provided in a two-dimensional array. In an embodiment, the number of optical columns corresponds to at least the number of fields or dies on the object 100. The array of electron beam columns enables cross-object inspection in parallel, i.e., at least one of the electron beam columns inspects a portion of the object at a same time as another at least one of the electron beam columns inspects another portion of the object.

Each electron beam column is miniature (e.g. 200 $mm^2$ or less, 170 $mm^2$ or less, 150 $mm^2$ or less, 120 $mm^2$ or less, 100 $mm^2$ or less, 80 $mm^2$ or less, 60 $mm^2$ or less, such as 10×10 mm or smaller in either or both dimensions). Further, each electron beam column provides at least one electron beam and has at least one detector. In an embodiment, each electron beam column is effectively an independent electron beam system. As noted above, in an embodiment, each column is placed in a pattern matching the position of each field or die on the object 100. With a 100 dies or fields of an object (e.g., a 300 mm diameter semiconductor substrate), there would be provided, e.g., 100 separate electron beam columns, each spaced by 1-30 millimeters from another (as distinct from the few micrometers space between multiple beams in a single column multi-beam inspection system).

In an embodiment, one or more of the electron beam columns are movable relative to another one or more of the electron beam columns. In an embodiment, each of the electron beam columns is independently movable. In an embodiment, an electron beam column is movable in a first direction and in a second direction essentially orthogonal to the first direction. In an embodiment, one or more groups of electron beam columns, each group comprising a plurality of electron beam columns, are movable relative to one or more other electron beam columns. For example, a column or row of electron beam columns is movable relative to another respective column or row of electron beam columns.

Referring to FIG. 6, an embodiment of actuator system is presented for moving electron beam columns. In this embodiment, a plurality of electron beam columns is mounted on a structure 610, a further plurality of electron beam columns is mounted on a further structure 610, and so on as appropriate. An actuator 620 of the actuator system causes at least one of the structures 610 to move in a first direction 640 to change a position of the at least one structure 610 relative to another structure 610. In an embodiment, the actuator 620 is arranged to change the pitch of the structures 610 (and thus the electron beam columns 600) in the direction 640 and thus change the spacing of the structures 610 uniformly. In an embodiment, the change in pitch is such that the pitch changes from a first uniform pitch among the structures 610 to a second different uniform pitch among the structures 610. In an embodiment, the actuator 620 is configured to move each of the structures 610 independently such that almost any spacing arrangement between the structures 610 can be provided. In an embodiment, the actuator 620 comprises a linear motor, a piezoelectric actuator and/or a belt system. In an embodiment, the actuator 620 can move the structure 610 in up to and including 6 degrees of freedom.

In an embodiment, the actuator system is configured to move the electron beam columns in a second direction 630 (which is, in an embodiment, essentially orthogonal to the first direction 640). Details of an embodiment of an actuator to move the electron beam columns 600 in the direction 630 will be described in respect of FIGS. 8 and 9.

Figure 7:
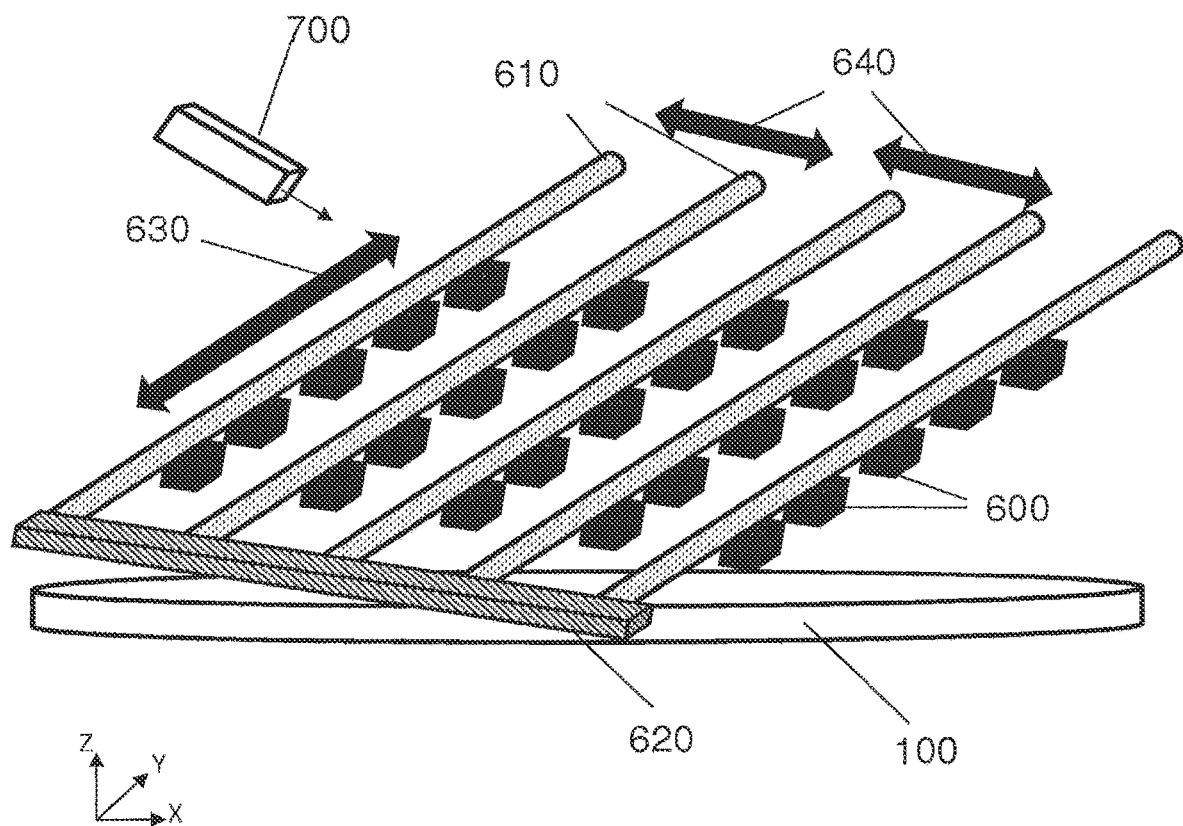
FIG. 7 schematically depicts a perspective view of an embodiment of a multi-column electron beam apparatus.

FIG. 7 is a highly schematic perspective view of an embodiment of a multi-column electron beam apparatus of the type described in respect of FIG. 6. As can be seen in FIG. 7, the electron beam columns 600 extend across the width/length of the object 100. While the electron beam columns 600 are shown as extending from the structures 610 in FIGS. 7 and 8, the electron beam columns 600 may be integrated inside of the structures 610 (e.g., the structure 610 is generally U-shaped to accommodate the electron beam columns in the U-shape).

Figure 8:
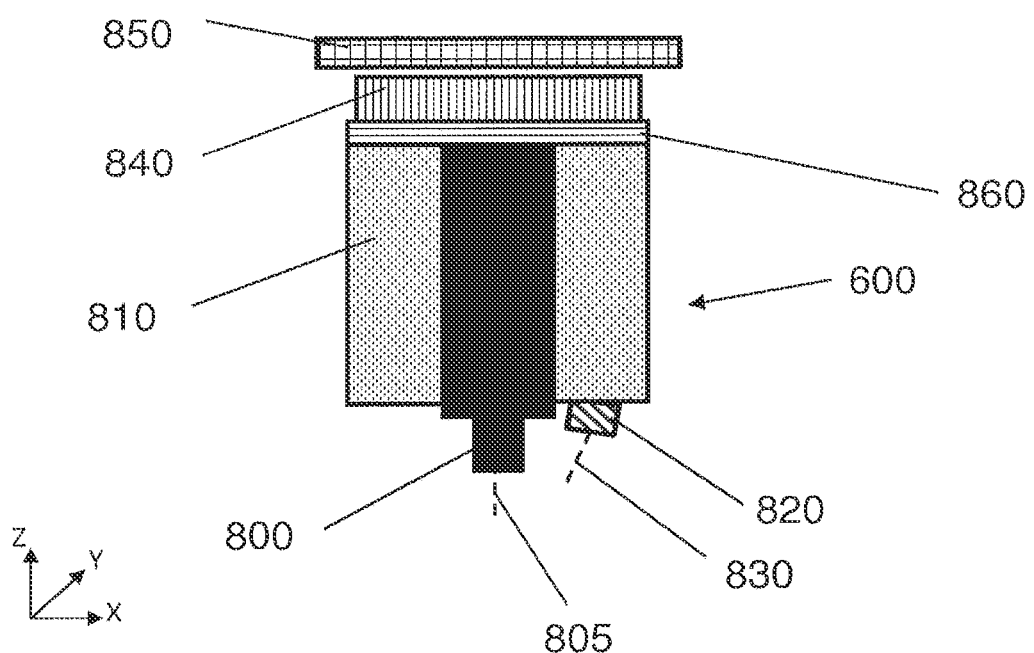
FIG. 8 schematically depicts a side view of an embodiment of a column of a multi-column electron beam apparatus.
Figure 9:
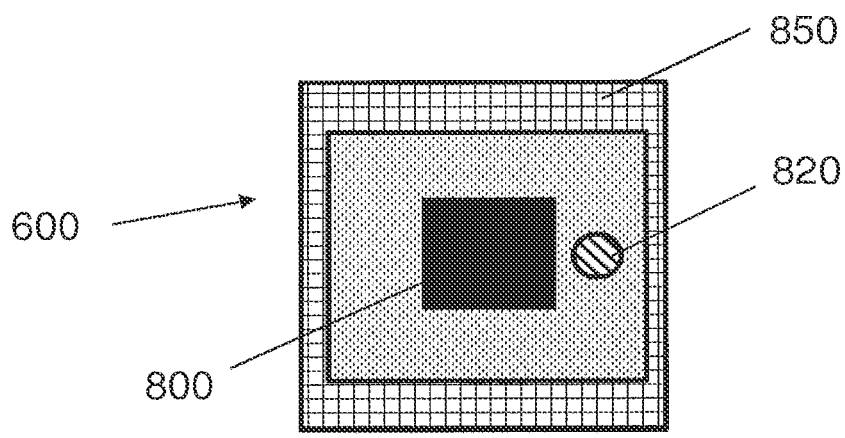
FIG. 9 schematically depicts a top or bottom view of an embodiment of a column of a multi-column electron beam apparatus.

FIG. 8 is a highly schematic side view of an embodiment of electron beam column 600. The electron beam column includes electron beam optics 800, electron beam processing equipment 810, an optional sensor 820, an actuator portion 840, and an optional actuator 860. FIG. 9 is a highly schematic top or bottom view of the embodiment of the electron beam column 600 of FIG. 8.

In an embodiment, the electron beam optics 800 comprises an electron beam source to produce the electron beam 805. In an embodiment, the electron beam optics 800 comprises one or more optical elements to focus and direct the electron beam toward the object (not shown here for convenience).

The electron beam processing equipment 810 comprises a detector configured to sense secondary and/or backscattered electrons from the object, the secondary and/or backscattered electrons arising from the beam from the electron beam optics 800 being incident on the object. Thus, the electron beam column acts as integrated supplier and detector of an electron beam to inspect a particular area of the object.

In an embodiment, the electron beam processing equipment 810 optionally comprises optics/structure that is configured to cause movement of the beam, e.g., tilt the beam. Thus, in this case, the electron beam column has a field of view wider than the width of the beam itself. Such optics/structure may move the beam (e.g., with a 1-30 nm spot size) within the field of view of the electron beam column, e.g., scan the field of view of the electron beam column. In an embodiment, the optics/structure are electrostatic. In an embodiment, the optics/structure, if any, of the electron beam processing equipment 810 and the electron beam optics 800 may all be electrostatic, i.e., there are no magnetic elements for processing the electron beam after emission and before incidence on the object. Such an arrangement enables a small electron beam column with optionally fast deflection. Alternatively, in another embodiment permanent magnetic elements combined with electrostatic elements may enable an alternative embodiment of a small column.

In an embodiment, the electron beam processing equipment 810 optionally comprises an electron column control system. The electron column control system enables control of the electron optics 800, the optional optics/structure configured to cause movement of the beam, the detector, the actuator portion 840 and/or 850, and/or the optional actuator 860. In an embodiment, the electron column control system comprises a central processing unit and local data storage to enable individual control by the electron beam column and thus effectively independent electron beam inspection. In an embodiment, each electron beam column has an identical, or nearly identical, datapath. So, as the electron beams are scanned over the object, images from each electron beam column are collected by its detector and the image data is transferred to the electron column's control system. The detection and processing at each column in parallel helps to avoid bottlenecks and enable high data volumes and rates.

In an embodiment, actuator portion 840 (of the actuator system, which includes actuator 620) enables the electron beam column 600 to move in the second direction 630 to change a position of the electron beam column 600 relative to another electron beam column. In an embodiment, the actuator portion 840 cooperates with actuator portion 850 located in or on the structure 610 to which the electron beam column 600 is attached. In an embodiment, the actuator portion 840 may comprise a coil or magnet and the actuator portion 850 may be the cooperating magnet or coil. In an embodiment, actuator portions 840, 850 form a linear motor. In an embodiment, only actuator portion 840 may be provided, e.g., a piezoelectric actuator. In an embodiment, only actuator portion 850 in or on the structure 610 is provided, e.g., a mechanical motor or belt system, to move the electron beam column 600. In an embodiment, the actuator portion 850 extends along a plurality of the electron beam columns (e.g., the length of the structure 610) or comprises portions along structure 610 corresponding to each electron beam column 600. In an embodiment, the actuator portion 840 and/or 850 is arranged to change the pitch of the electron beam columns 600 on a structure 610 in the direction 630 and thus change the spacing of the electron beam columns 600 uniformly. In an embodiment, the change in pitch is such that the pitch changes from a first uniform pitch among the electron beam columns 600 to a second different uniform pitch among the electron beam columns 600. In an embodiment, the actuator portion 840 and/or 850 is configured to move each of electron beam columns 600 independently such that almost any spacing arrangement between electron beam columns 600 along a structure 610 can be provided. In an embodiment, the actuator portion 840 and/or 850 comprises a linear motor, a piezoelectric actuator and/or a belt system. In an embodiment, the actuator portion 840 and/or 850 can move the electron beam column in up to and including 6 degrees of freedom.

Figure 14:
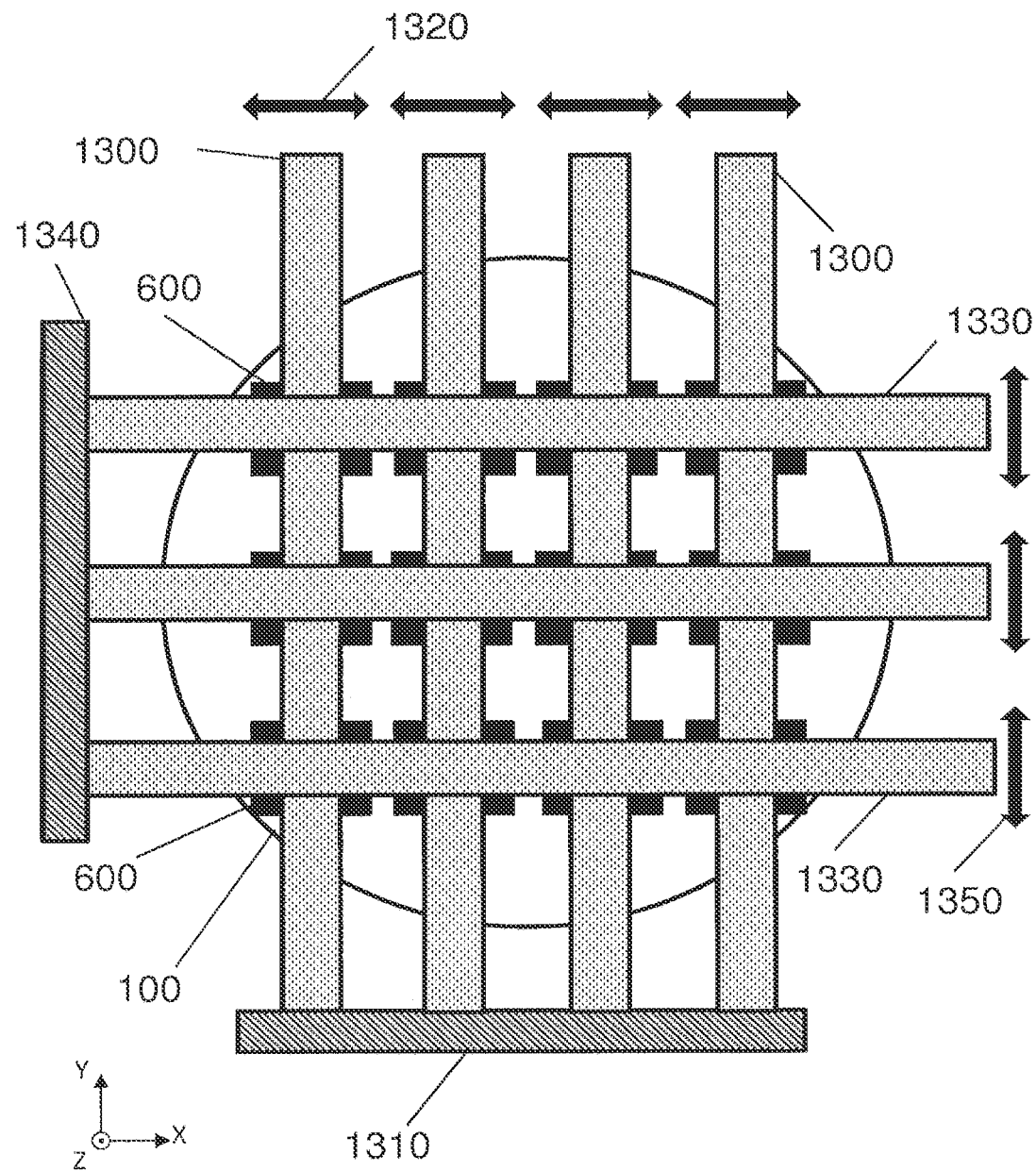
FIG. 14 schematically depicts a top or bottom view of an embodiment of a multi-column electron beam apparatus.

FIG. 14 is a highly schematic representation of an embodiment of a multi-column electron beam inspection system comprising an array of electron beam columns 600, each electron beam column corresponding to at least one die or field on object 100. Thus, in an embodiment, a plurality of miniature electron beam columns is arranged in an array (e.g., a substantially horizontal array)—in this case, a two-dimensional array. The array of electron beam columns enables cross-object inspection in parallel, i.e., at least one of the electron beam columns inspects a portion of the object at a same time as another at least one of the electron beam columns inspects another portion of the object.

In an embodiment, one or more of the electron beam columns are movable relative to another one or more of the electron beam columns. In an embodiment, an electron beam column is movable in a first direction and in a second direction essentially orthogonal to the first direction. In an embodiment, one or more groups of electron beam columns, each group comprising a plurality of electron beam columns, are movable relative to one or more other electron beam columns. For example, a column or row of electron beam columns is movable relative to another respective column or row of electron beam columns.

In this embodiment, a combination of long and short stroke positioning units are provided to position each electron beam column within the scan field on the object. For the long stroke movement, a grid of structures are provided to independently move clusters of electron beam columns in two generally orthogonal directions (e.g., X or in Y), as shown schematically in the top or bottom view of FIG. 14. The short stroke positioning unit will be described hereafter in respect of FIG. 15 and includes a two-dimensional short stroke actuator for an individual electron beam column. A typical number of scan fields on an object is 100, so a grid of for example 10×10 electron beam columns involves 10 structures along the X-direction and 10 structures along the Y-direction. The schematic example of FIG. 14 shows 4 columns along the X-direction and 3 rows along the Y-direction. In an embodiment, the grid comprises a plurality of structures essentially perpendicular with another plurality of the structures, but in an embodiment, the structures need not be perpendicular.

Referring to FIG. 14, an embodiment of a long stroke actuator system is presented for moving electron beam columns. In this embodiment, a plurality of electron beam columns is mounted on a structure 1300, a further plurality of electron beam columns is mounted on a further structure 1300, and so on as appropriate. An actuator 1310 of the actuator system causes at least one of the structures 1300 to move in a first direction 1320 to change a position of the at least one structure 1300 relative to another structure 1300. In an embodiment, the actuator 1310 is arranged to change the pitch of the structures 1300 (and thus the electron beam columns 600) in the direction 1320 and thus change the spacing of the structures 1300 uniformly. In an embodiment, the change in pitch is such that the pitch changes from a first uniform pitch among the structures 1300 to a second different uniform pitch among the structures 1300. In an embodiment, the actuator 1310 is configured to move each of the structures 1300 independently such that almost any spacing arrangement between the structures 1300 can be provided. In an embodiment, the actuator 1310 can move each or a combination of structures 1300 in up to and including 6 degrees of freedom.

In this embodiment, a plurality of electron beam columns is mounted on a structure 1330, a further plurality of electron beam columns is mounted on a further structure 1330, and so on as appropriate. In an embodiment, the electron beam columns mounted to structures 1330 are those mounted to structures 1300. An actuator 1340 of the actuator system causes at least one of the structures 1330 to move in a second direction 1350 (which is, in an embodiment, essentially orthogonal to the first direction 1320) to change a position of the at least one structure 1330 relative to another structure 1330. In an embodiment, the actuator 1340 is arranged to change the pitch of the structures 1330 (and thus the electron beam columns 600) in the direction 1350 and thus change the spacing of the structures 1330 uniformly. In an embodiment, the change in pitch is such that the pitch changes from a first uniform pitch among the structures 1330 to a second different uniform pitch among the structures 1330. In an embodiment, the actuator 1340 is configured to move each of the structures 1330 independently such that almost any spacing arrangement between the structures 1330 can be provided. In an embodiment, the actuator 1340 can move each or a combination of structures 1330 in up to and including 6 degrees of freedom.

In FIG. 14 (and shown in FIG. 15), the structures 1330 overlap the structures 1300. While structures 1330 are shown overlying structures 1300, they need not be. For example, structures 1300 could be overlying structures 1330. As another example, the structures 1300 and 1330 could be effectively interwoven such that portions of a structure 1300 are between adjacent structures 1330 (or vice versa). As another example, the structures 1300 could pass through the body of structures 1330 (or vice versa) using one or more appropriate slots.

In an embodiment, the actuator 1310 and/or actuator 1340 comprises a linear motor, a piezoelectric actuator and/or a belt system. In an embodiment, the actuator 1310 can move a structure 1300 in up to and including 6 degrees of freedom and/or the actuator 1340 can move a structure 1330 in up to and including 6 degrees of freedom. In an embodiment, the actuator 1310 and/or actuator 1340 can provide, for example, up to 200 mm range (e.g., up 50 mm range, up to 100 mm range, up to 150 mm range) at up to 200 mm/s (e.g., up to 50 mm/s, up to 100 mm/s, up to 150 mm/s) for long stroke movement. In an embodiment, the actuator 1310 and/or actuator 1340 provide a lateral accuracy in the range of 10-100 µm.

In an embodiment, the one or more of motors for the long stroke movement and/or for the short stroke movement are not significantly influenced by electric and/or magnetic fields (and desirably should not provide electric and/or magnetic fields that influence an electron beam column 600). In an embodiment, the motors for the long stroke movement and/or for the short stroke movement are piezoelectric motors. A piezo-electric motor is typically insensitive to electric and/or magnetic fields. In an embodiment, the piezo-electric motor provides essentially no electric and/or magnetic fields. A piezo motor (e.g., linear, walk, hexapod, etc. piezo-motor) can provide the range and/or speed for respective the long stroke movement and/or for the short stroke movement.

Figure 15:
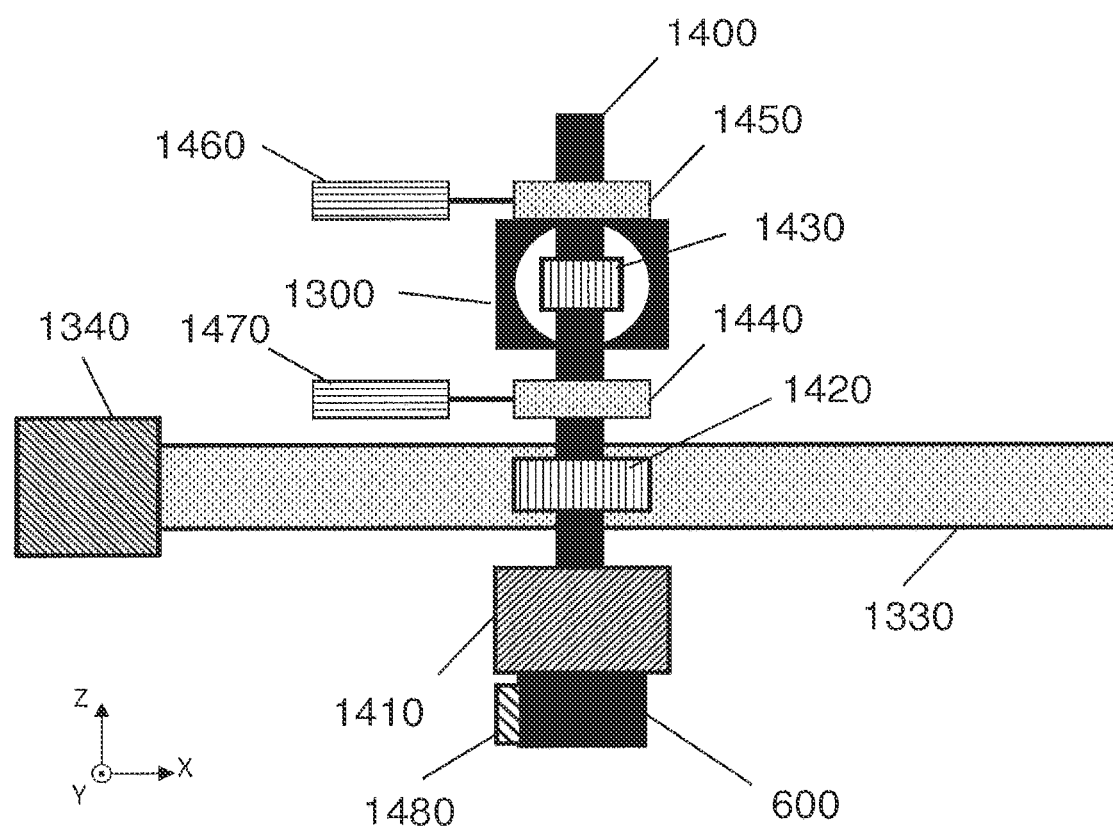
FIG. 15 schematically depicts a side view of an embodiment of a column of a multi-column electron beam apparatus.

Referring to FIG. 15, in an embodiment, independent long stroke movement in the first and second directions 1320, 1350 is achieved by applying, for example, a gear box type construction. FIG. 15 is highly schematic side view of an embodiment of a double structure gear box type mechanism for long stroke movement of electron beam columns 600 in parallel, where the electron beam columns 600 can be placed, for example, below the long stroke positioning unit using structures 1300, 1330. A structure 1400 (e.g., a rod or pole) is provided onto which is attached a short stroke actuator 1410. Onto the short stroke actuator 1410 is attached an electron beam column 600.

In an embodiment, the short stroke actuator 1410 enables fine movement of the electron beam column 600 in, e.g., up to 6 degrees of freedom, including, e.g., the first and second directions 1320, 1350. In an embodiment, the actuator 1410 comprises a linear motor, a piezoelectric actuator and/or a belt system. In an embodiment, the actuator 1410 comprises a piezo electric motor. In an embodiment, the actuator 1410 can provide, for example, up to 20 mm range (e.g., up 5 mm range, up to 10 mm range, up to 15 mm range) for fine stroke movement. As will be appreciated, the range of the actuator 1410 would typically be smaller than the range of the actuators 1310, 1340. In an embodiment, actuator 1410 has dimensions within the size of a single scan field on the object to prevent the electron beam columns 600 from hindering each other.

The structure 1400 can move along a structure 1330 in the first direction 1320 (which structure 1330 can be moved in the second direction 1350 by actuator 1340) and along a structure 1300 in the second direction 1350 (which structure 1300 can be moved in the first direction 1320 by the actuator 1310 (not shown in FIG. 15)). In an embodiment, the structure 1400 (with the attached electron beam column 600) is guided for movement along the structure 1330 by a bearing 1420 attached to the structure 1400. In an embodiment, the bearing 1420 is guided by an interior (as shown in FIG. 15) or exterior surface of the structure 1330. In an embodiment, the structure 1400 (with the attached electron beam column 600) is guided for movement along the structure 1300 by a bearing 1430 attached to the structure 1400. In an embodiment, the bearing 1430 is guided by an interior (as shown in FIG. 15) or exterior surface of the structure 1300. In an embodiment, actuator 1410 allows for short stroke positioning within 2 µm lateral accuracy within each specific scan field.

Further, separate brakes 1440, 1450 are provided to allow the separate movement of the structure 1400 and the attached electron beam column 600 in the first and second directions 1320, 1350. In an embodiment, the brakes are actuated to be closed or open by respectively actuators 1460, 1470. If the brake 1440 is closed against the structure 1330, the structure 1400 and the attached electron beam column 600 are fixed in position on the structure 1330 (and thus the structure 1400 and the attached electron beam column 600 cannot move relative to the structure 1330 while the brake 1440 is closed and so, in an embodiment, cannot move in a long stroke manner in the first direction 1320 while the brake 1440 is closed). In FIG. 15, however, the brake 1440 is shown as open and so the structure 1400 and the attached electron beam column 600 can move along structure 1330 when structure 1300 is moved in the first direction 1320. To enable movement of the structure 1400 and the attached electron beam column 600 with the structure 1300 in the first direction 1320, the brake 1450 is closed as shown in FIG. 15 such that the structure 1400 and the attached electron beam column 600 are fixed in position on the structure 1300. In order for the structure 1400 and the attached electron beam column 600 to move in the second direction 1350 along structure 1300, the brake 1450 would be opened and the brake 1440 closed and then the structure 1330 would be moved in the second direction 1350 by actuator 1340. Thus, by selective opening and closing of brakes 1440, 1450 by actuators 1460, 1470 in combination with movement of the structures 1300, 1330, the structure 1400 and the attached electron beam column 600 can be moved to a desired position. As will be appreciated, a plurality of structures 1400 with respective attached electron beam columns 600 can be provided, each having a respective set of brakes 1440, 1450. In an embodiment, a single actuator can be provided for both brakes 1440, 1450. In an embodiment, the brakes 1440, 1450 are operated manually.

Referring to FIG. 16A, one or more of the electron beam columns 600 can be placed below (or above) the long stroke system comprising a grid of overlapping structures 1300, 1330, as shown in FIGS. 2 and 3. Thus, in an embodiment, all of an electron beam column 600 is located below the lowest (or above the highest) structure 1300, 1330. In the example of FIGS. 2 and 16A, each of the electron beam columns 600 is located at partly underneath (or above) the center of an intersection of a structure 1300 with a structure 1330. As will be appreciated, the intersection is an imaginary location where overlapping structures cross. FIG. 17A shows an example of an electron beam column 600 located completely below the lowest (or above the highest) structure 1300, 1330 and/or located at partly underneath (or above) the center of an intersection of a structure 1300 with a structure 1330.

Referring to FIG. 16B, to save space in the Z direction and/or for added mechanical stability, one or more of the electron beam columns 600 can be placed to the side of an adjacent structure 1300 and/or adjacent structure 1330, e.g., to the side of each intersection, as shown in FIG. 16B. Thus, in an embodiment, one or more of the electron beam columns 600 is not located underneath (or above) a structure 1300 and/or structure 1330. FIG. 17B shows an example of an electron beam column 600 located to the side of an adjacent structure 1300 and/or adjacent structure 1330 and/or not located underneath (or above) a structure 1300 and/or structure 1330. As shown in FIG. 17B, an electron beam column 600 can be located at least partly in a gap between adjacent structures 1300/1330 and thus the actuator 1410 and/or electron beam column 600 is located above a bottom surface (or below a top surface) of the adjacent structures 1300/1330. In this embodiment, the brake 1440 and/or brake 1450 operates against a side of its respective structure 1300, 1330. Thus, in this embodiment, the structure 1400 can be bent to accommodate the location of the electron beam column 600 in the gap. For example, the structure 1400 can extend from the side of structure 1300 (as seen in FIG. 17B) and/or can extend from the side of the structure 1330 (as seen in FIG. 17B). The embodiment of FIGS. 16B and 17B otherwise use the same principles of moving the electron beam columns 600 (e.g., using brakes 1440, 1450 and movement of structures 1300, 1330).

In an embodiment, one or more of the electron beam columns 600 and/or structures 1400 can have a metrology module 1480, e.g. a radiation source (e.g., a laser) and a sensor, to measure the distance to one or more neighboring electron beam columns 600 and/or structures 1400 in order to determine its exact position with respect to the object scan field (e.g., so as to efficiently and/or accurately inspect within its associated die or field). Alternatively or additionally, the metrology module 1480 can measure the distance between an electron beam column 600 and one or more structures 1300, 1330 of the long stroke system in order to determine its exact position with respect to the object scan field. Additionally or alternatively, the metrology module 1480 (e.g., in the form of sensor 820 as described below) can measure the position of the electron beam column 600 with respect to the object scan field using one or more markers on the object, e.g. on each die or field.

In an embodiment, to enable fine positioning, the structures 1300, 1330 can be moved in a first, relatively low resolution mode to cause one or more of the electron beam columns 600 to scan over a relatively large scan area, e.g. more than 1 µm² and up to 200 µm². In an embodiment, one or more techniques, such as pattern recognition, can be used to accurately localize a region of interest (e.g. defect area). In a second step, a plurality of the electron beam columns 600 are moved to their inspection positions with high accuracy using, e.g., structures 1300, 1330 and/or actuator 1410, and then followed by a high resolution scan over a small area (desirably enclosing the region of interest), such as an area more than 0.1 µm² and up to 2 µm². In an embodiment, for the second step, the electron beam columns 600 are not physically moved, but only the object is moved off-center to perform the small area scanning or both the electron beam columns 600 and the object are moved to perform the small area scanning.

Thus, in an embodiment, there is provided a long stroke system comprising overlapping structures holding electron beam columns above their respective scan fields using, e.g., a gear box type of construction to independently move the electron beam columns in two different direction (e.g., in the X and Y directions). In an embodiment, piezo long and short stroke motors can be provided for accurate positioning and/or electric/magnetic interference free positioning. In an embodiment, there is provided the possibility to position the short stroke actuator and/or electron beam column on the side of the long stroke structures.

So, with the actuator system described herein, the electron beam columns can be arranged to conform to different object sizes. Further, the actuator system can be arranged to conform to different arrangements of fields or dies in terms of different size fields or dies, different pitches of fields or dies, different shapes of fields or dies, etc. The adjustments are made so that the electron beam columns are each matched with a different field or die and so only the general pitch in, e.g., X and/or Y of the electron beam columns is adjusted so as to match the electron beam columns with a respective field or die location.

Thus, in an embodiment, the plurality of beams are at a pitch that is an integer times the field or die pitch/spacing. So, in an embodiment, in order to allow the die or field size or spacing to be variable, the actuator system enables the beams to move over a distance of half the field or die pitch in X and/or Y. In an embodiment, the electron beam columns are spaced at least larger than 2 times the pitch so as to enable the range of movement of the columns.

While an embodiment has described using movable structures 610, the movement of the electron beam columns 600 can be implemented in different manner. For example, each of the electron beam columns may individually move in the X and Y directions relative to a generally planar structure. For example, each electron beam column may have a coil or magnet that cooperates with a planar arrangement of coils and magnets, akin to a planar motor. Further, while the object is depicted underneath the electron beam columns in the Figures, the object could instead be located above the electron beam columns.

In an embodiment, during inspection, the electron beam columns are substantially stationary. Thus, prior to inspection, the electron beam columns are adjusted in X and/or Y to match the field or die positions/sizes, and then the electron beam columns are substantially fixed during inspection. During inspection, only the object may be moved relative to the pre-positioned electron beam columns. Optionally, the beam may be deflected to enable scanning of the electron beam during inspection as discussed above.

Figure 10:
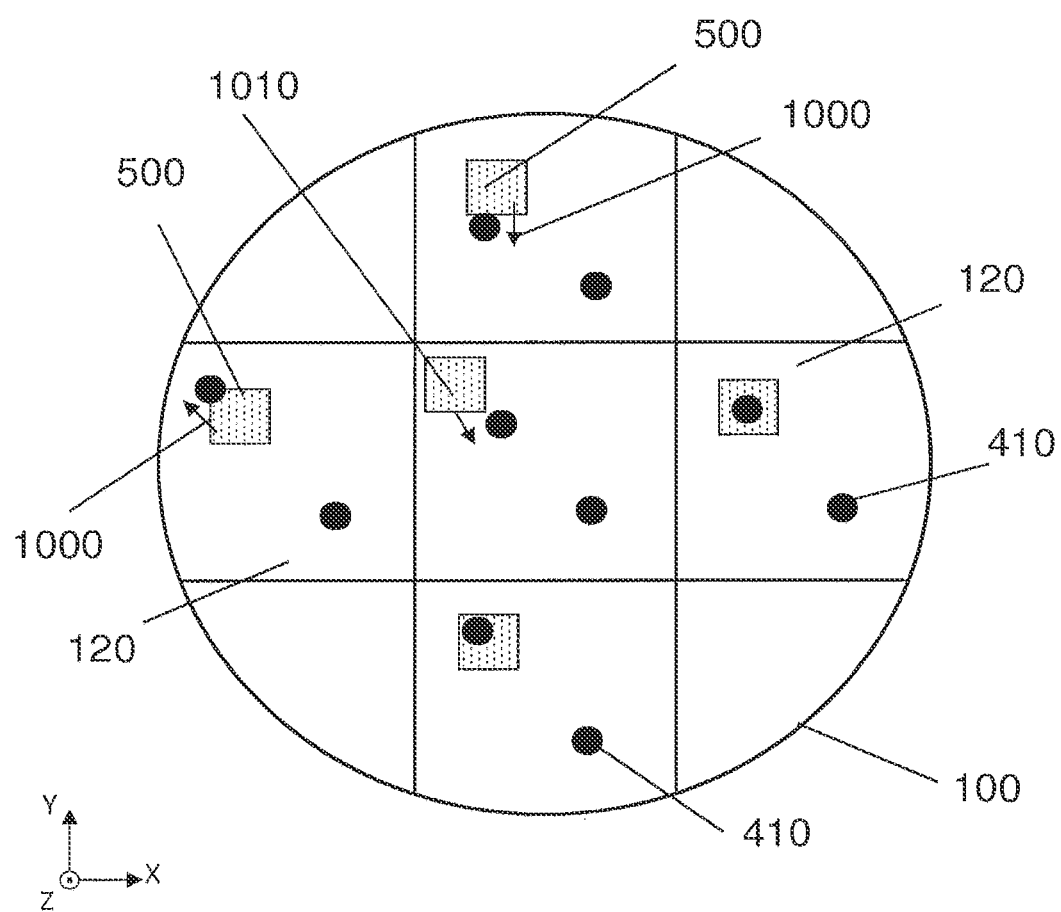
FIG. 10 schematically depicts an embodiment of adjustment of certain columns of a multi-column electron beam apparatus.

Further, in an embodiment, referring to FIG. 10, at least the electron beam optics (which may include up to the entire electron beam column) may be slightly adjusted 1000, 1010 in position (e.g., horizontal position or tilt) using actuator 860. Such adjustment may occur while the object is moved relative to the electron beam columns during the processing the object as a whole for inspection; for example, at least the electron beam optics position may be changed during the period while the object is moved to place a new inspection area within the die or field to within the field of view of the associated electron beam column. In an embodiment, the adjustment may be to account for errors in the location of an electron beam column or its electron beam optics, which may arise from movement by, for example, actuator 620 and/or actuator 840, 850. In that case, in an embodiment, actuator 860 can move the electron beam optics, for example, in direction 1010, to put the electron beam optics in a desired position. In an embodiment, the adjustment may be, e.g., in a direction 1000, to account for misalignment with an area having a suspected defect as described hereafter.

Similarly, the electron beam column 600 may be slightly adjusted 1000, 1010 in position (e.g., horizontal position or tilt) using actuator 840, 850. Such adjustment may occur while the object is moved relative to the electron beam columns during the processing the object as a whole for inspection; for example, an individual electron beam column position may be changed during the period while the object is moved to place a new inspection area within the die or field to within the field of view of the associated electron beam column. In an embodiment, the adjustment may be to account for errors in the location of an electron beam column, which may arise from movement by, for example, actuator 620 and/or actuator 840, 850. In that case, in an embodiment, actuator 840, 850 can move the electron beam column, for example, in direction 1010, to put the electron beam column (and its electron beam optics) in a desired position. In an embodiment, the adjustment may be, e.g., in a direction 1000, to account for misalignment with an area having a suspected defect as described hereafter.

The adjustment as described above may be based on sensor data as described hereafter and/or based on other measured data, such as alignment, overlay and mask registration data that helps locate where a pattern feature of a pattern is located in the corresponding die or field at the object, i.e., computationally predict a shift of the pattern feature on the object.

In an embodiment, electron beam column optionally comprises an actuator 860 to move the electron beam optics 800 and/or electron beam processing equipment 810. The actuator 860 may enable fine movement compared to the relatively coarse movement provided by actuator portion 840 and/or 850. In an embodiment, the actuator 860 comprises a linear motor and/or a piezoelectric actuator. In an embodiment, the actuator 860 can move the electron beam optics 800 and/or electron beam processing equipment 810 in up to and including 6 degrees of freedom In an embodiment, the electron beam column comprises an optional sensor 820. In an embodiment, the sensor 820 provides radiation 830 (e.g., light) to determine the position of the electron beam column relative to the object. For example, the sensor 820 can determine a distance from the electron beam column to the object and/or determine a tilt between the electron beam column and the object. Additionally or alternatively, in an embodiment, the sensor 820 measures an alignment mark or other target on the object to determine a relative position between the electron beam column and a location on the object. Such information can be supplied to the actuator system for moving the electron beam column (e.g., actuator portion 840 and/or 850) and/or electron beam optics (e.g., actuator 860) to enable control of the position of the electron beam column and/or electron beam optics respectively, and/or to the optics/structure of the electron beam processing equipment 810 for moving the beam to enable control of the position of the electron beam.

A smaller field of view decreases the pixel size, enabling detection of smaller pattern excursions, but requires more accurate alignment. So, provided the columns are well aligned by high-precision mechatronics or by using, for example, sensors, a smaller field of view can be used, yielding higher resolution and higher inspection speed.

Further, in an embodiment, there is provided a synergistic combination of computational defect prediction with parallel inspection using a plurality of electron beam columns arranged at dies or fields as discussed above to enable increased throughput, accuracy and/or efficiency by inspecting less than the entire area of the respective dies or fields. For example, computational defect prediction could reduce the size of the area to be inspected by ~2-3 orders and so provide significantly faster inspection to identify potentially defective features on the object, compared to a single-beam electron beam inspection apparatus or a multi-beam electron beam inspection apparatus. For example, a single-beam electron beam apparatus would take a significant amount of time to scan a die or field, let alone all the dies or fields on the object, and moreover spend much of that time inspecting pattern features that are fine. Further, a multi-beam electron beam apparatus would have a relatively large, combined field of view across the several beams. But an area where a defect is likely to occur (~0.5-3 $\mu m^2$) is already smaller than the field of view of a single beam (~100 $\mu m^2$), let alone a combined field of view of 10,000 $\mu m^2$ (e.g., 10×10 array of beams). So, only one or a couple of expected defects would fall within the combined field of view and so a multi-beam electron beam apparatus would not significantly speed-up inspection of defects.

The improvement in, e.g., throughput can be achieved because of the insight that many defects are systematic and pattern-dependent (e.g., on a semiconductor wafer) and so the likelihood is fairly high that computational defect prediction will identify defects in the same or similar positions in each die or field (except perhaps for the edge of a semiconductor wafer). Thus, if the electron beam columns are pre-aligned with the dies or fields, a single relative movement between the group of electron beam columns and the object will place respective areas having one or more predicted defects within the field of view of all, a majority, or many of the electron beam columns, thus enabling parallel inspection. In other words, the electron beam columns can be kept fundamentally stationary relative to each other during and between inspections so that a relative movement between the collection of electron beam columns and the object can in parallel locate the impact point of each electron beam at a respective area in each die or field having one or more potential defects. In this manner, the electron beams can be quickly in parallel located at potentially defective areas. Moreover, less than the entire area of each die or field would need to be inspected with an electron beam in order to achieve significant speed and throughput gains.

Thus, in an embodiment, there is provided a two-dimensional array of miniature electron beam columns, with at least one column per object die or field, that inspect less than the entire area of each respective die or field based on identification of one or more areas in the respective die or field having a potential for one or more defects. In an embodiment, the one or more defects are computationally predicted by, e.g., simulation. In an embodiment, the electron beam columns are adjustable in pitch in at least the X and/or Y direction to enable alignment with dies or fields.

As mentioned above, in an embodiment, an entire die or field of the object is not inspected. In an embodiment, the majority of dies or fields of the object are not inspected. In an embodiment, the entire patterned part of the object is not inspected. In an embodiment, an area having a potential defect can be termed a hotspot. A hotspot is area comprising one or more pattern features that can have a tendency to have a defect in their patterning. So, in an embodiment, the inspection system can inspect discrete hotspots within a die or field. In an embodiment, a hotspot area measures 2 microns square or less (e.g., 1.41×1.41 microns, 1×1 microns or 0.77×0.77 microns). A die or field may have a plurality of hotspot areas. In many cases, the hotspot areas will be discrete within the die or field. In an embodiment, a plurality of hotspot areas may be located adjacent to each other such that they overlap or connect, thus forming a contiguous group of hotspot areas. So, by inspecting only the hotspots, electron beam object inspection throughput can be increased by about two orders of magnitude (~100 times).

In an embodiment, areas of predicted defects (e.g., hotspots) can be identified using any suitable method from a pattern (e.g., a pattern of or for a patterning device). For example, areas of predicted defects may be identified by analyzing at least a part of the pattern using an empirical model or a computational model. In an empirical model, images (e.g., resist image, optical image, etch image) of the pattern are not simulated; instead, the empirical model predicts defects or probability of defects based on correlations between processing parameters, parameters of the pattern, and the defects. For example, an empirical model may be a classification model or a database of patterns prone to defects. In a computational model, a portion or a characteristic of the pattern as printed is calculated or simulated, and defects are identified based on the portion or the characteristic. For example, a line pull back defect may be identified by finding a line end too far away from its desired location; a bridging defect may be identified by finding a location where two lines undesirably join; an overlapping defect may be identified by finding that two features on separate layers undesirably overlap or undesirably do not overlap. In another example, areas of predicted defects may be determined experimentally, such as by focus exposure matrix substrate qualification or a suitable metrology tool.

In an embodiment, one or more areas comprising one or more predicted defects are determined based on a design rule check. Design rules can include specification of a minimum spacing between two features, a minimum dimension of a feature, etc. Thus, the pattern to be printed can be checked for compliance with design rules and those portions of the pattern failing to comply or close failing to comply with a design rule can be identified (and experimentally tested by patterning of substrates). Such portions can be considered as care areas, which are areas of the pattern (die) having higher sensitivity to process excursions (and thus having a higher likelihood for a defect).

In an embodiment, one or more areas comprising one or more predicted defects are determined based on one or more patterning process mathematical models at nominal conditions (this can be for the full pattern (full chip) or for a library of known problem pattern features). Portions of the pattern (or pattern features) can be identified that print poorly even under nominal conditions (and thus have a higher likelihood for a defect). Such portions can be considered as care patterns.

In an embodiment, one or more areas comprising one or more predicted defects are determined by simulation using one or more patterning process mathematical models that use design data of the pattern and data from the patterning process. For example, the process described in respect of FIG. 13 can be used to derive the existence of areas of predicted defects, as well as determine their location in a respective field or die. In an embodiment, the simulation process described in respect of FIG. 13 can be performed for varying different excursions from the nominal conditions to identify those patterns (hotspots) with higher sensitivity to process excursions (and thus having a higher likelihood for a defect). Optionally, the simulation can be further augmented with measured data for or from one or more substrates exposed with the pattern. For example, a measured focus map for one or more substrates may identify the focus for dies or fields (or portions thereof) and based on the focus map, only those dies or fields (or portions thereof) with a de-focus exceeding a threshold are inspected; this may, however, yield a lower capture rate since it would not check all the possibly sensitive areas across all dies or fields.

In an embodiment, a hotspot may be identified by evaluating the process windows of features in a region of a pattern. A process window for a feature of a pattern is a space of processing parameters (e.g., dose and focus) under which the feature will be produced within specification on a substrate. Examples of pattern specifications that relate to potential defects include checks for necking, line pull back, line thinning, CD, edge placement, overlapping, resist top loss, resist undercut and bridging. Various features in the region of the pattern may have different process windows. The combined process window of all the features in the region may be obtained by merging (e.g., overlapping) the process window of each individual feature in that region. The boundary of the process window of all the features contains boundaries of the process windows of some of the individual features. In other words, these individual features limit the combined process window of all the features in the region. These features can be referred to as "hotspots." Thus, when evaluating which areas of an object are to be inspected, it is possible and economical to focus on the hotspots which are effectively those pattern features that do not fall within the combined process window of the particular region. When a hotspot in the region as printed on the substrate is not defective, it is most likely that the all the features in the region are not defective. It is possible to determine and/or compile process windows of the hotspots into a map, based on hotspot locations and process windows of individual hotspots—i.e. determine process windows as a function of location. This process window map may characterize the layout-specific sensitivities and processing margins of the pattern. In an embodiment, the ASML Tachyon FEM model software may be used to identify hotspots.

In an embodiment, only the one or more care areas, care patterns or hotspots per die or field are inspected using the multi-electron beam column apparatus described herein. In an embodiment, the care areas, care patterns or hotspots are smaller than the field of view of the electron beam column. In an embodiment, the care areas, care patterns or hotspots have area of between 0.05-10 $\mu m^2$, 0.1-5 $\mu m^2$, or 0.5-2 $\mu m^2$.

Figure 11:
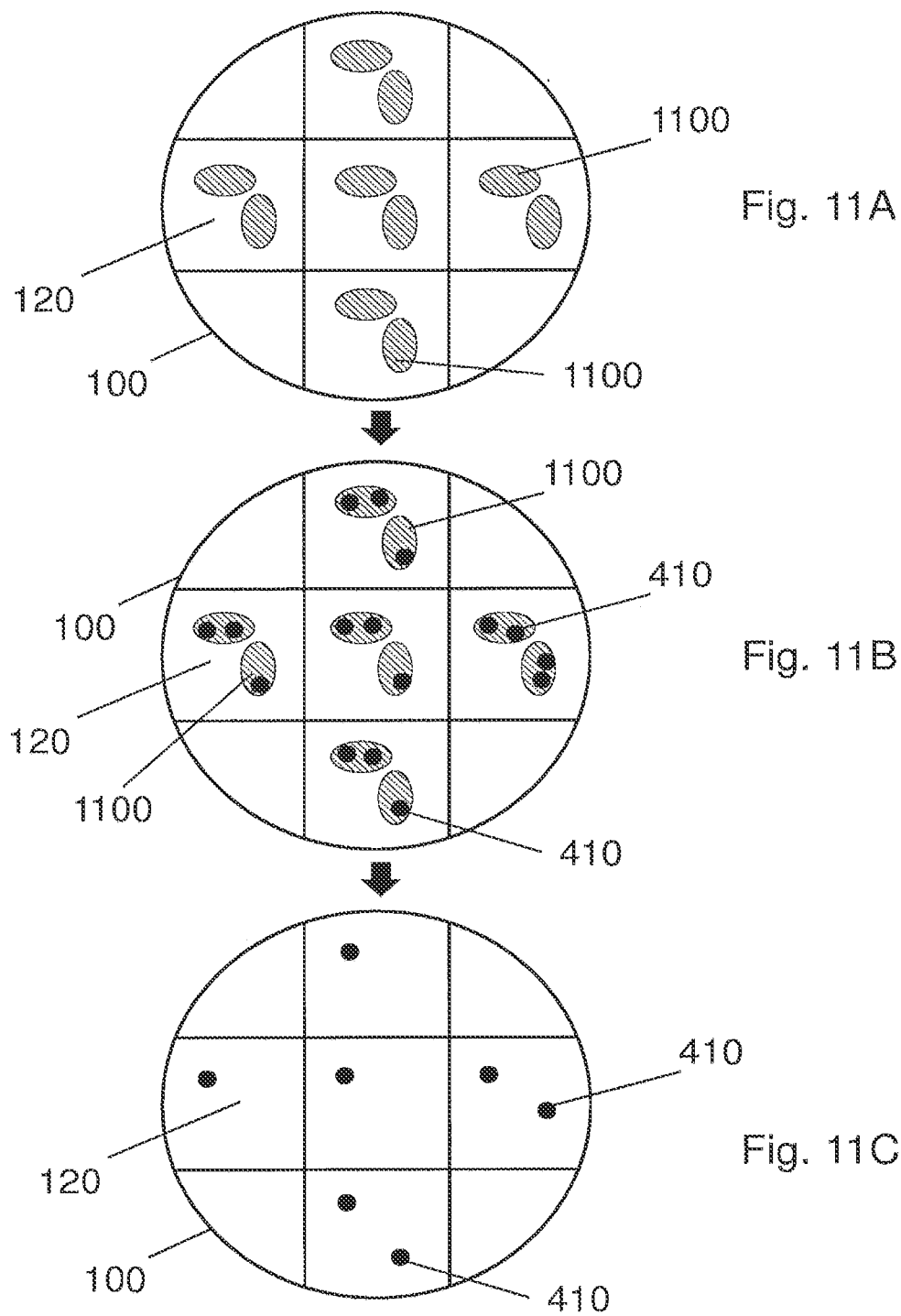
FIGS. 11A, 11B and 11C schematically depict an embodiment of a method of processing an object to identify defects.

Referring to FIGS. 11A, 11B and 11C, an embodiment of a technique of using bright-field inspection is highly schematically shown using care areas 1100. In FIG. 11A, care areas 1100 have been determined for each field or die 120 of the object 100. The care areas 1100 can be determined as described above. Then, referring to FIG. 11B, bright-field inspection is used to inspect the care area to identify suspected defects 410. The care areas are typically inspected by providing relative movement between the object and the bright-field beam so that all the care areas are inspected. The bright-field inspection may not be capable of definitively identifying whether the suspected defects 410 are actual defects because the features or defects may be too small. Electron beam defect review is then performed at FIG. 11C to identify which of the suspected defects 410 are actual defects and optionally characterize the defects (e.g., provide a CD value). As shown in this example, the number of actual defects in FIG. 11C is less than the suspected defects in FIG. 11B. As can be seen, this process can be, for example, quite time-consuming.

Figure 12:
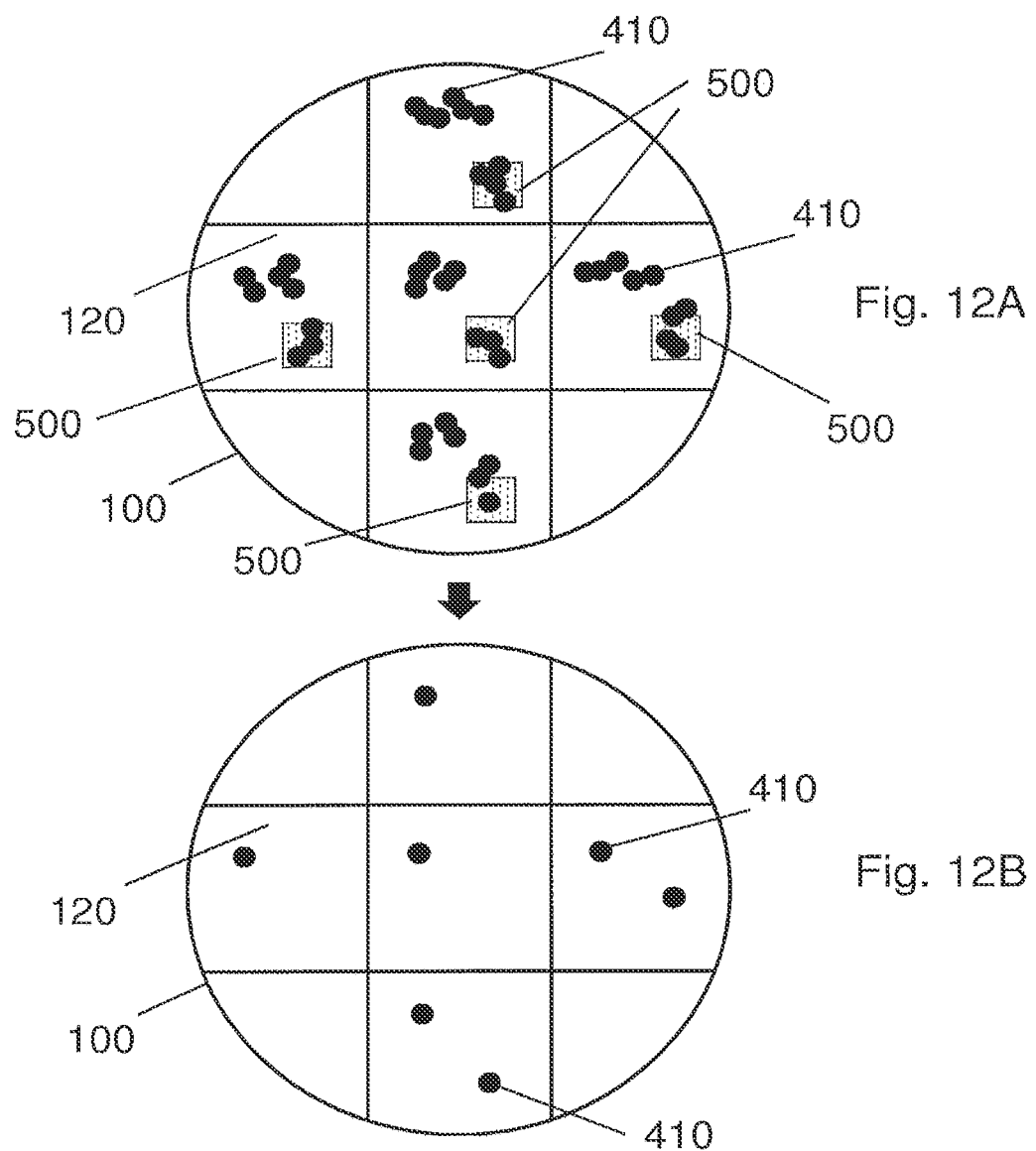
FIGS. 12A and 12B schematically depict an embodiment of a method of processing an object to identify defects.

Referring to FIGS. 12A and 12B, an embodiment of electron beam inspection using a plurality of electron beam columns and predicted hotspots is highly schematically illustrated. In FIG. 12A, one or more hotspots 410 for each field or die 120 on the object 100 is determined using techniques as described above. Typically, there will be a plurality of hotspots per field or die. Further, as shown in FIG. 12A, many of the hotspots may occur in the same or similar locations in each field or die. In an embodiment, a margin may be added to each identified hotspot location to help ensure that the respective electron beam has a high likelihood of inspecting whether the hotspot has the predicted defect or not. Further, the threshold for identifying a hotspot may be lower for defect inspection than used for controlling, designing, etc. a patterning process. This is so that even "marginal" hotspots are evaluated to help ensure more completeness. For example, to balance proper capture rate against risk of inaccurate simulation, there would be, in an embodiment, more predicted hotspots than bright-field identified suspected defects.

Further, as shown in FIG. 12A, the fields of view 500 of the electron beam columns 600 per field or die are shown. In this example, each of the fields of view 500 aligns with an area having one or more hotspots. If one or more of those fields of view 500 did not align with area having one or more hotspots, the process could still proceed except those fields of view wouldn't be "productive" and further inspecting might be needed to cover areas that couldn't be simultaneously inspected by all or a majority of the electron beams. In an embodiment, a slight adjustment could be made to those one or more fields of view 500 that are not aligned with an area having one or more hotspots as described with respect to FIG. 10.

Then, relative motion is performed between the electron beam columns and the object at FIGS. 12A and 12B so that the respective fields of view are aligned on all the hotspot areas so that electron beam inspection can be performed. Subsequently or concurrently, the results of electron beam inspection are evaluated to identify whether a hotspot is defective or not and optionally characterize the defects (e.g., provide a CD value). As shown in this example, the number of actual defects in FIG. 12B is less than the hotspots in FIG. 12A.

While FIGS. 12A and 12B were described in respect of hotspots, the same process can be used for care areas and/or care patterns. However, the care areas and/or care patterns may be larger in area than hotspot and so may be more time-consuming to inspect, although there will be an increase in throughput in inspecting those using a plurality of electron beam columns compared to the process of FIGS. 11A-C.

Thus, the techniques described herein could replace bright-field inspection, including during process ramp and including bright-field that uses computed areas of predicted defects (such as care areas or care patterns). To enable high throughput, the total area of predicted hotspots could be ~2-3 orders smaller than total care areas estimated for bright-field inspection. Further, a plurality of electron beam columns arranged to measure in parallel could inspect all predicted hotspots ~1-2 orders faster than a single electron beam defect review identifies actual defects as shown in FIG. 11C. 30, 40, 60, 70, 80, 90, 100, 110 or more electron beam columns would enable such speed-up.

The results of the inspection can be used in various ways. For example, the pattern feature associated with a hotspot identified as defective can be, for example, removed or corrected in the design process, have its patterning compensated for by changing a process parameter, etc. A hotspot identified as not being defective can be used to tune the model. A contour of the hotspot (whether defective or not) can be used to calibrate the model, i.e., the contour produced by the model can be compared with the measured contour and then the model updated accordingly.

While the discussion above has mostly focused on inspection of a substrate in the form of, e.g., a semiconductor wafer, the apparatuses and methods herein can be applied to a patterning device (e.g., a mask or reticle). That is the inspected object can be a patterning device. Accordingly, the number of electron beam columns may be appropriately selected.

In an embodiment, a patterning device is corrected based on a parameter derived from the detected electrons by the electron beam columns. In an embodiment, the correction is made where the inspected object is the patterning device itself or a similar version, or copy, of the patterning device. In an embodiment, the correction is made where the inspected object is a substrate onto which a pattern is transferred (e.g., a semiconductor substrate). In an embodiment, In an embodiment, the apparatuses and methods described herein are adapted to additionally, or alternatively, enable patterning device repair. That is, in an embodiment, a multiple electron beam column apparatus is provided that enables repair in parallel at multiple dies or fields. The electron beams provided by the electron beam columns can enable the repair (and optionally may be used for detecting as described herein). In an embodiment, the electron beams enable removal of material from the patterning device. If the electron beam columns enable measurement, then the power of the electron beams can be adjusted between measurement and repair. In an embodiment, to enable repair, a material may be provided to interact with the electron beams. In an embodiment, an outlet 700 is provided to supply a precursor fluid (e.g., a gas). The fluid can enable deposition of material when used in combination with the electron beams. In an embodiment, an ion supply device is used in place of, or in combination with, the electron beam columns to enable the repair. In an embodiment, the ion supply devices are configured to provide a metal ion. Details of repair of a patterning device can be found in, for example, U.S. Patent Application Publication No. 2004-0151991 and U.S. Pat. No. 7,916,930, which are incorporated herein in their entirety by reference.

Further, while the discussion above has mostly focused on inspection using electron beam columns, a different inspection apparatus than an electron beam column could be used in the apparatuses and methods described herein. That is, each of the plurality of electron beam columns can be replaced by, or supplemented with, a different inspection apparatus. Other than the difference in the type of inspection apparatus, the apparatuses and methods described herein would be fundamentally the same except modified to accommodate the different inspection apparatuses.

In an embodiment, there is provided an electron beam inspection apparatus to inspect an object comprising a plurality of dies or fields, the apparatus comprising: a plurality of electron beam columns, each electron beam column configured to provide an electron beam and detect scattered or secondary electrons from the object, each electron beam column arranged to inspect a different respective field or die associated with the electron beam column; and a non-transitory computer program product comprising machine-readable instructions, at least some of the instructions configured to cause relative movement between the object and the electron beam columns such that each of the electron beams inspects an area of its respective field or die less than the entire area of the respective field or die.

In an embodiment, at least one of the areas comprises an identified hotspot. In an embodiment, at least some of the instructions are configured to determine the existence and/or location of the hotspot. In an embodiment, at least some of the instructions are configured to identify the hotspot by simulation. In an embodiment, the plurality of electron beam columns is arranged in a two-dimensional array and comprises at least 30 electron beam columns. In an embodiment, the apparatus further comprises an actuator system configured to move one or more of the electron beam columns relative to another one or more of the electron beam columns. In an embodiment, at least some of the instructions are configured to cause a plurality of the electron beams to impinge respective areas of their respective fields or dies at a same time.

In an embodiment, there is provided an electron beam inspection apparatus, comprising: a plurality of electron beam columns, each electron beam column configured to provide an electron beam and detect scattered or secondary electrons from the object, each electron beam column arranged to inspect an area of a different respective field or die associated with the electron beam column; and an actuator system configured to move one or more of the electron beam columns relative to another one or more of the electron beam columns.

In an embodiment, the actuator system is configured to change a pitch of the plurality of electron beam columns. In an embodiment, the plurality of electron beam columns is arranged in a two-dimensional array and the actuator system is configured to change a position of an electron beam column in a first direction and in a second direction substantially orthogonal to the first direction. In an embodiment, each electron beam column is movable independently of the other electron beam columns. In an embodiment, the plurality of electron beam columns comprises at least 30 electron beam columns. In an embodiment, the apparatus further comprises a non-transitory computer program product comprising machine-readable instructions configured to cause relative movement between the object and the electron beam columns such that each of the electron beams inspects an area of its respective field or die less than the entire area of the respective field or die. In an embodiment, at least one of the areas comprises an identified hotspot. In an embodiment, the apparatus comprises a non-transitory computer program product comprising machine-readable instructions configured to determine the existence and/or location of the hotspot. In an embodiment, the apparatus comprises a non-transitory computer program product comprising machine-readable instructions configured to identify the hotspot by simulation.

In an embodiment, there is provided a method of electron beam inspection of an object comprising a plurality of dies or fields, the method comprising: having a plurality of electron beam columns, each electron beam column configured to provide an electron beam and detect scattered or secondary electrons from the object and each electron beam column arranged to inspect a different respective field or die associated with the electron beam column; causing relative movement between the object and the plurality of electron beam columns such that each of the electron beams inspects an area of its respective field or die less than the entire area of the respective field or die; providing the electron beams onto the object from the electron beam columns; and detecting scattered or secondary electrons from the object using the electron beam columns.

In an embodiment, at least one of the areas comprises an identified hotspot. In an embodiment, the method further comprises determining, by a computer, the existence and/or location of the hotspot. In an embodiment, the method further comprises identifying the hotspot by computer simulation. In an embodiment, the plurality of electron beam columns is arranged in a two-dimensional array and comprises at least 30 electron beam columns. In an embodiment, the method further comprises moving one or more of the electron beam columns relative to another one or more of the electron beam columns using an actuator. In an embodiment, the object comprises a patterning device or a semiconductor wafer. In an embodiment, the method further comprises repairing the object or a patterning device, based on a parameter derived from the detected electrons from the object.

In an embodiment, there is provided a method of electron beam inspection, the method comprising: having a plurality of electron beam columns, each electron beam column configured to provide an electron beam and detect scattered or secondary electrons from an object and each electron beam column arranged to inspect an area of a different respective field or die associated with the electron beam column; and moving one or more of the electron beam columns relative to another one or more of the electron beam columns using an actuator system.

In an embodiment, the method comprises changing a pitch of the plurality of electron beam columns. In an embodiment, the plurality of electron beam columns is arranged in a two-dimensional array and changing a position of an electron beam column in a first direction and in a second direction substantially orthogonal to the first direction. In an embodiment, each electron beam column is movable independently of the other electron beam columns. In an embodiment, the plurality of electron beam columns comprises at least 30 electron beam columns. In an embodiment, the method further comprises causing relative movement between the object and the electron beam columns such that each of the electron beams inspects an area of its respective field or die less than the entire area of the respective field or die. In an embodiment, at least one of the areas comprises an identified hotspot. In an embodiment, the method further comprises determining, by a computer, the existence and/or location of the hotspot. In an embodiment, the method further comprises identifying the hotspot by computer simulation. In an embodiment, the object comprises a patterning device or a semiconductor wafer. In an embodiment, the method further comprises repairing the object or a patterning device, based on a parameter derived from the detected electrons from the object.

In an embodiment, there is provided an electron beam inspection apparatus, the apparatus comprising: a plurality of electron beam columns, each electron beam column configured to provide an electron beam and detect scattered or secondary electrons from an object; and an actuator system configured to move one or more of the electron beam columns relative to another one or more of the electron beam columns, the actuator system comprising a plurality of first movable structures at least partly overlapping a plurality of second movable structures, the first and second movable structures supporting the plurality of electron beam columns.

In an embodiment, one or more of the first movable structures is movable relative to another one or more of the first movable structures and/or one or more of the second movable structures is movable relative to another one or more of the second movable structures. In an embodiment, an electron beam column of the electron beam columns is connected to a column structure having a first component thereof that physically and movably engages with a first movable structure of the first movable structures and a second component thereof that physically and movably engages with a second movable structure of the second movable structures. In an embodiment, the first component is located within the first movable structure and/or the second component is located within the second movable structure. In an embodiment, the apparatus further comprises a first brake configured to engage with the first movable structure in order to hold the column structure in fixed position in relation to the first movable structure and/or a second brake configured to engage with the second movable structure in order to hold the column structure in fixed position in relation to the second movable structure. In an embodiment, the apparatus comprises the first brake and the second brake and further comprises a control system configured to cause the first brake to be engaged, while the second brake is disengaged, to allow the second movable structure to move the electron beam column of the column structure and to cause the second brake to be engaged, while the first brake is disengaged, to allow the first movable structure to move the electron beam column of the column structure. In an embodiment, one or more the electron beam columns is located to a side of an adjacent first movable structure and/or second movable structure and in a gap between adjacent first movable structures and/or adjacent second movable structures. In an embodiment, at least one of the electron beam columns is connected to a short stroke actuator having a movement range smaller than a movement range of the first and second movable structures. In an embodiment, the apparatus further comprises a plurality of sensors, each configured to measure a distance to enable determination of a position of an associated electron beam column in respect of an adjacent electron beam column. In an embodiment, each electron beam column is arranged to inspect an area of a different respective field or die of the object associated with the electron beam column. In an embodiment, the apparatus further comprises a non-transitory computer program product comprising machine-readable instructions, at least some of the instructions configured to cause relative movement between the object and the electron beam columns such that each of the electron beams inspects an area of its respective field or die less than the entire area of the respective field or die.

In an embodiment, there is provided a method of electron beam inspection, the method comprising: having a plurality of electron beam columns, each electron beam column configured to provide an electron beam and detect scattered or secondary electrons from an object; moving one or more of the electron beam columns relative to another one or more of the electron beam columns using an actuator system, the actuator system comprising a plurality of first movable structures at least partly overlapping a plurality of second movable structures, the first and second movable structures supporting the plurality of electron beam columns; providing the electron beams onto the object from the electron beam columns; and detecting scattered or secondary electrons from the object using the electron beam columns.

In an embodiment, the method comprises moving one or more of the first movable structures relative to another one or more of the first movable structures and/or moving one or more of the second movable structures relative to another one or more of the second movable structures. In an embodiment, an electron beam column of the electron beam columns is connected to a column structure having a first component thereof and a second component thereof and the method further comprises moving the first component while in physical engagement with a first movable structure of the first movable structures and moving the second component while in physical engagement with a second movable structure of the second movable structures. In an embodiment, the first component is located within the first movable structure and/or the second component is located within the second movable structure. In an embodiment, the method further comprises engaging a first brake with the first movable structure in order to hold the column structure in fixed position in relation to the first movable structure and/or engaging a second brake with the second movable structure in order to hold the column structure in fixed position in relation to the second movable structure. In an embodiment, the method comprises causing the first brake to be engaged, while the second brake is disengaged, to allow the second movable structure to move the electron beam column of the column structure and causing the second brake to be engaged, while the first brake is disengaged, to allow the first movable structure to move the electron beam column of the column structure. In an embodiment, one or more the electron beam columns is located to a side of an adjacent first movable structure and/or second movable structure and in a gap between adjacent first movable structures and/or adjacent second movable structures. In an embodiment, the method further comprises moving at least one of the electron beam columns using a short stroke actuator having a movement range smaller than a movement range of the first and second movable structures. In an embodiment, the method further comprises using a plurality of sensors, each measuring a distance to enable determination of a position of an associated electron beam column in respect of an adjacent electron beam column. In an embodiment, each electron beam column is arranged to inspect an area of a different respective field or die of the object associated with the electron beam column. In an embodiment, the method further comprises causing relative movement between the object and the electron beam columns such that each of the electron beams inspects an area of its respective field or die less than the entire area of the respective field or die. In an embodiment, the object comprises a patterning device or a semiconductor wafer. In an embodiment, the method further comprises repairing the object or a patterning device, based on a parameter derived from the detected electrons from the object.

In an embodiment, there is provided a patterning device repair apparatus, comprising: a plurality of beam columns, each beam column configured to provide a beam of radiation, each beam column arranged to repair an area of a different respective field or die of a patterning device associated with the beam column using the respective beam of radiation; and an actuator system configured to move one or more of the beam columns relative to another one or more of the beam columns.

In an embodiment, each of the beam columns are further configured to detect scattered or secondary electrons from the patterning device. In an embodiment, each beam column is arranged to inspect an area of a different respective field or die associated with the beam column. In an embodiment, the beam columns are respectively configured to provide an electron beam. In an embodiment, the beam columns are respectively configured to provide an ion beam.

In association with an imaging apparatus such as a SEM, an embodiment may include a computer program containing one or more sequences of machine-readable instructions that enable practice of a method as described herein. This computer program may be included, for example, with or within the imaging apparatus of FIG. 3 and/or with or within the control unit LACU of FIG. 2. There may also be provided a data storage medium (e.g., semiconductor memory, magnetic or optical disk) having such a computer program stored therein. Where an existing apparatus, for example of the type shown in FIGS. 1-3, is already in production and/or in use, an embodiment can be implemented by the provision of updated computer program products for causing a processor of the apparatus to perform a method as described herein.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according to the machine readable instructions of one or more computer programs.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further, although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The term "optimizing" and "optimization" as used herein refers to or means adjusting a patterning process apparatus, one or more steps of a patterning process, etc. such that results and/or processes of patterning have more desirable characteristics, such as higher accuracy of transfer of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

The invention may further be described using the following clauses:

1. An electron beam inspection apparatus to inspect an object comprising a plurality of dies or fields, the apparatus comprising:
   a plurality of electron beam columns, each electron beam column configured to provide an electron beam and detect scattered or secondary electrons from the object, each electron beam column arranged to inspect a different respective field or die associated with the electron beam column; and
   a non-transitory computer program product comprising machine-readable instructions, at least some of the instructions configured to cause relative movement between the object and the electron beam columns such that each of the electron beams inspects an area of its respective field or die less than the entire area of the respective field or die.
2. The apparatus of clause 1, wherein at least one of the areas comprises an identified hotspot.
3. The apparatus of clause 2, wherein at least some of the instructions are configured to determine the existence and/or location of the hotspot.
4. The apparatus of clause 2 or clause 3, wherein at least some of the instructions are configured to identify the hotspot by simulation.
5. The apparatus of any of clauses 1 to 4, wherein the plurality of electron beam columns are arranged in a two-dimensional array and comprises at least 30 electron beam columns.
6. The apparatus of any of clauses 1 to 5, further comprising an actuator system configured to move one or more of the electron beam columns relative to another one or more of the electron beam columns.
7. The apparatus of any of clauses 1 to 6, wherein at least some of the instructions are configured to cause a plurality of the electron beams to impinge respective areas of their respective fields or dies at a same time.
8. An electron beam inspection apparatus, comprising:
   a plurality of electron beam columns, each electron beam column configured to provide an electron beam and detect scattered or secondary electrons from an object, each electron beam column arranged to inspect an area of a different respective field or die associated with the electron beam column; and an actuator system configured to move one or more of the electron beam columns relative to another one or more of the electron beam columns.

9. The apparatus of clause 8, wherein the actuator system is configured to change a pitch of the plurality of electron beam columns.

10. The apparatus of clause 8 or clause 9, wherein the plurality of electron beam columns is arranged in a two-dimensional array and the actuator system is configured to change a position of an electron beam column in a first direction and in a second direction substantially orthogonal to the first direction.

11. The apparatus of any of clauses 8 to 10, wherein each electron beam column is movable independently of the other electron beam columns.

12. The apparatus of any of clauses 8 to 11, wherein the plurality of electron beam columns comprises at least 30 electron beam columns.

13. The apparatus of any of clauses 8 to 12, further comprising a non-transitory computer program product comprising machine-readable instructions configured to cause relative movement between the object and the electron beam columns such that each of the electron beams inspects an area of its respective field or die less than the entire area of the respective field or die.

14. The apparatus of any of clauses 8 to 13, wherein at least one of the areas comprises an identified hotspot.

15. The apparatus of clause 14, comprising a non-transitory computer program product comprising machine-readable instructions configured to determine the existence and/or location of the hotspot.

16. The apparatus of clause 14 or clause 15, comprising a non-transitory computer program product comprising machine-readable instructions configured to identify the hotspot by simulation.

17. A method of electron beam inspection of an object comprising a plurality of dies or fields, the method comprising:
having a plurality of electron beam columns, each electron beam column configured to provide an electron beam and detect scattered or secondary electrons from the object and each electron beam column arranged to inspect a different respective field or die associated with the electron beam column;
causing relative movement between the object and the plurality of electron beam columns such that each of the electron beams inspects an area of its respective field or die less than the entire area of the respective field or die;
providing the electron beams onto the object from the electron beam columns; and
detecting scattered or secondary electrons from the object using the electron beam columns.

18. The method of clause 17, wherein at least one of the areas comprises an identified hotspot.

19. The method of clause 18, further comprising determining, by a computer, the existence and/or location of the hotspot.

20. The method of clause 18 or clause 19, further comprising identifying the hotspot by computer simulation.

21. The method of any of clauses 17 to 20, wherein the plurality of electron beam columns are arranged in a two-dimensional array and comprises at least 30 electron beam columns.

22. The method of any of clauses 17 to 21, further comprising moving one or more of the electron beam columns relative to another one or more of the electron beam columns using an actuator.

23. The method of any of clauses 17 to 22, wherein the object comprises a patterning device or a semiconductor wafer.

24. The method of any of clauses 17 to 23, further comprising repairing the object or a patterning device, based on a parameter derived from the detected electrons from the object.

25. A method of electron beam inspection, the method comprising:
having a plurality of electron beam columns, each electron beam column configured to provide an electron beam and detect scattered or secondary electrons from an object and each electron beam column arranged to inspect an area of a different respective field or die of the object associated with the electron beam column; and
moving one or more of the electron beam columns relative to another one or more of the electron beam columns using an actuator system.

26. The method of clause 25, comprising changing a pitch of the plurality of electron beam columns.

27. The method of clause 25 or clause 26, wherein the plurality of electron beam columns is arranged in a two-dimensional array and changing a position of an electron beam column in a first direction and in a second direction substantially orthogonal to the first direction.

28. The method of any of clauses 25 to 27, wherein each electron beam column is movable independently of the other electron beam columns.

29. The method of any of clauses 25 to 28, wherein the plurality of electron beam columns comprises at least 30 electron beam columns.

30. The method of any of clauses 25 to 28, further comprising causing relative movement between the object and the electron beam columns such that each of the electron beams inspects an area of its respective field or die less than the entire area of the respective field or die.

31. The method of any of clauses 25 to 30, wherein at least one of the areas comprises an identified hotspot.

32. The method of clause 31, further comprising determining, by a computer, the existence and/or location of the hotspot.

33. The method of clause 31 or clause 32, further comprising identifying the hotspot by computer simulation.

34. The method of any of clauses 25 to 33, wherein the object comprises a patterning device or a semiconductor wafer.

35. The method of any of clauses 25 to 34, further comprising repairing the object or a patterning device, based on a parameter derived from the detected electrons from the object.

36. An electron beam inspection apparatus, the apparatus comprising:
a plurality of electron beam columns, each electron beam column configured to provide an electron beam and detect scattered or secondary electrons from an object; and
an actuator system configured to move one or more of the electron beam columns relative to another one or more of the electron beam columns, the actuator system comprising a plurality of first movable structures at least partly overlapping a plurality of second movable structures, the first and second movable structures supporting the plurality of electron beam columns.

37. The apparatus of clause 36, wherein one or more of the first movable structures is movable relative to another one or more of the first movable structures and/or one or more of the second movable structures is movable relative to another one or more of the second movable structures.

38. The apparatus of clause 36 or clause 37, wherein an electron beam column of the electron beam columns is connected to a column structure having a first component thereof that physically and movably engages with a first movable structure of the first movable structures and a second component thereof that physically and movably engages with a second movable structure of the second movable structures.

39. The apparatus of clause 38, wherein the first component is located within the first movable structure and/or the second component is located within the second movable structure.

40. The apparatus of clause 38 or clause 39, further comprising a first brake configured to engage with the first movable structure in order to hold the column structure in fixed position in relation to the first movable structure and/or a second brake configured to engage with the second movable structure in order to hold the column structure in fixed position in relation to the second movable structure.

41. The apparatus of clause 40, comprising the first brake and the second brake and further comprising a control system configured to cause the first brake to be engaged, while the second brake is disengaged, to allow the second movable structure to move the electron beam column of the column structure and to cause the second brake to be engaged, while the first brake is disengaged, to allow the first movable structure to move the electron beam column of the column structure.

42. The apparatus of any of clauses 36 to 41, wherein one or more the electron beam columns is located to a side of an adjacent first movable structure and/or second movable structure and in a gap between adjacent first movable structures and/or adjacent second movable structures.

43. The apparatus of any of clauses 36 to 42, wherein at least one of the electron beam columns is connected to a short stroke actuator having a movement range smaller than a movement range of the first and second movable structures.

44. The apparatus of any of clauses 36 to 43, further comprising a plurality of sensors, each configured to measure a distance to enable determination of a position of an associated electron beam column in respect of an adjacent electron beam column.

45. The apparatus of any of clauses 36 to 44, wherein each electron beam column is arranged to inspect an area of a different respective field or die of the object associated with the electron beam column.

46. The apparatus of clause 45, further comprising a non-transitory computer program product comprising machine-readable instructions, at least some of the instructions configured to cause relative movement between the object and the electron beam columns such that each of the electron beams inspects an area of its respective field or die less than the entire area of the respective field or die.

47. A method of electron beam inspection, the method comprising:
having a plurality of electron beam columns, each electron beam column configured to provide an electron beam and detect scattered or secondary electrons from an object;
moving one or more of the electron beam columns relative to another one or more of the electron beam columns using an actuator system, the actuator system comprising a plurality of first movable structures at least partly overlapping a plurality of second movable structures, the first and second movable structures supporting the plurality of electron beam columns;
providing the electron beams onto the object from the electron beam columns; and
detecting scattered or secondary electrons from the object using the electron beam columns.

48. The method of clause 47, comprising moving one or more of the first movable structures relative to another one or more of the first movable structures and/or moving one or more of the second movable structures relative to another one or more of the second movable structures.

49. The method of clause 47 or clause 48, wherein an electron beam column of the electron beam columns is connected to a column structure having a first component thereof and a second component thereof and further comprising moving the first component while in physical engagement with a first movable structure of the first movable structures and moving the second component while in physical engagement with a second movable structure of the second movable structures.

50. The method of clause 49, wherein the first component is located within the first movable structure and/or the second component is located within the second movable structure.

51. The method of clause 49 or clause 50, further comprising engaging a first brake with the first movable structure in order to hold the column structure in fixed position in relation to the first movable structure and/or engaging a second brake with the second movable structure in order to hold the column structure in fixed position in relation to the second movable structure.

52. The method of clause 51, comprising causing the first brake to be engaged, while the second brake is disengaged, to allow the second movable structure to move the electron beam column of the column structure and causing the second brake to be engaged, while the first brake is disengaged, to allow the first movable structure to move the electron beam column of the column structure.

53. The method of any of clauses 47 to 52, wherein one or more the electron beam columns is located to a side of an adjacent first movable structure and/or second movable structure and in a gap between adjacent first movable structures and/or adjacent second movable structures.

54. The method of any of clauses 47 to 53, further comprising moving at least one of the electron beam columns using a short stroke actuator having a movement range smaller than a movement range of the first and second movable structures.

55. The method of any of clauses 47 to 54, further comprising using a plurality of sensors, each measuring a distance to enable determination of a position of an associated electron beam column in respect of an adjacent electron beam column.
56. The method of any of clauses 47 to 55, wherein each electron beam column is arranged to inspect an area of a different respective field or die of the object associated with the electron beam column.
57. The method of clause 56, further comprising causing relative movement between the object and the electron beam columns such that each of the electron beams inspects an area of its respective field or die less than the entire area of the respective field or die.
58. The method of any of clauses 47 to 57, wherein the object comprises a patterning device or a semiconductor wafer.
59. The method of any of clauses 47 to 58, further comprising repairing the object or a patterning device, based on a parameter derived from the detected electrons from the object.
60. A patterning device repair apparatus, comprising:
a plurality of beam columns, each beam column configured to provide a beam of radiation, each beam column arranged to repair an area of a different respective field or die of a patterning device associated with the beam column using the respective beam of radiation; and
an actuator system configured to move one or more of the beam columns relative to another one or more of the beam columns.
61. The apparatus of clause 60, wherein each of the beam columns are further configured to detect scattered or secondary electrons from the patterning device.
62. The apparatus of clause 61, wherein each beam column is arranged to inspect an area of a different respective field or die associated with the beam column.
63. The apparatus of any of clauses 60 to 62, wherein the beam columns are respectively configured to provide an electron beam.
64. The apparatus of any of clauses 60 to 62, wherein the beam columns are respectively configured to provide an ion beam.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. An electron beam apparatus comprising:
a stage configured to support an object comprising a plurality of dies or fields, each field or die having a boundary to enable separation of the object into pieces;
a plurality of electron beam columns, each electron beam column configured to provide concurrently a plurality of electron beams to the object when supported on the stage and to detect scattered or secondary electrons from the object, each electron beam column arranged to inspect a different region of the object associated with the electron beam column and each electron beam having its own respective concurrent field of view at the object; and
an actuator system configured to move one or more of the electron beam columns relative to another one or more of the electron beam columns in a direction closer to or further away from the object.

2. The apparatus of claim 1, wherein the electron beam columns are arranged in a two-dimensional array.

3. The apparatus of claim 1, wherein each column comprises an E×B deflector configured to deflect electrons from the object to a detector of the respective column.

4. The apparatus of claim 1, wherein a non-transitory computer program product comprising machine-readable instructions configured to cause at least one of the electron beam columns to inspect a portion of the object at a same time as another at least one of the electron beam columns is caused to inspect another portion of the object.

5. The apparatus of claim 1, further comprising a non-transitory computer program product comprising machine-readable instructions configured to cause relative movement between the object and the electron beam columns for inspection or measurement such that, during the inspection or measurement, a span in all directions of a combined field of view of the plurality of electron beams of a respective electron beam column is less than the span in all directions of the field or die being inspected by those electron beams of the respective electron beam column.

6. The apparatus of claim 1, wherein the electron beams of each column are arranged in a two-dimensional array.

7. An electron beam apparatus comprising:
a stage configured to support an object comprising a plurality of dies or fields, each field or die having a boundary to enable separation of the object into pieces;
a plurality of electron beam columns, each electron beam column configured to provide concurrently a plurality of electron beams to the object when supported on the stage, each electron beam column arranged to inspect a different region of the object associated with the electron beam column and each electron beam having its own respective concurrent field of view at the object; and
an actuator system configured to move one or more of the electron beam columns relative to another one or more of the electron beam columns in a direction closer to or further away from the object.

8. The apparatus of claim 7, wherein the electron beam columns are arranged in a two-dimensional array.

9. The apparatus of claim 7, wherein each column comprises an E×B deflector configured to deflect electrons from the object to a detector of the respective column.

10. The apparatus of claim 7, wherein a non-transitory computer program product comprising machine-readable instructions configured to cause at least one of the electron beam columns to inspect a portion of the object at a same time as another at least one of the electron beam columns is caused to inspect another portion of the object.

11. The apparatus of claim 7, further comprising a non-transitory computer program product comprising machine-readable instructions configured to cause relative movement between the object and the electron beam columns for inspection or measurement such that, during the inspection or measurement, a span in all directions of a combined field of view of the plurality of electron beams of a respective electron beam column is less than the span in all directions of the field or die being inspected by those electron beams of the respective electron beam column.

12. The apparatus of claim 7, wherein the number of optical columns corresponds to at least the number of fields or dies on the object.

13. The apparatus of claim 7, wherein the electron beams of each column are arranged in a two-dimensional array.

14. The apparatus of claim 7, further comprising a plurality of detectors configured to detect scattered or secondary electrons from the object, each detector associated with a respective electron beam column.

15. An electron beam apparatus comprising:
- a stage configured to support an object comprising a plurality of dies or fields, each field or die having a boundary to enable separation of the object into pieces;
- a stage configured to support the object;
- a plurality of electron beam optics, each electron beam optic configured to separately direct a plurality of electron beams concurrently to the object when supported on the stage, each electron beam optic arranged to inspect a different region of the object associated with the electron beam optic and each electron beam having its own respective concurrent field of view at the object; and
- an actuator system configured to move one or more of the electron beam optics relative to another one or more of the electron beam optics in a direction closer to or further away from the object.

16. The apparatus of claim 15, wherein each electron beam optic has an associated detector to detect scattered or secondary electrons from the object and the actuator system is configured to move together the associated electron beam optic detector.

17. The apparatus of claim 15, wherein each column comprises an E×B deflector configured to deflect electrons from the object to a detector of the respective column.

18. The apparatus of claim 15, wherein a non-transitory computer program product comprising machine-readable instructions configured to cause at least one of the electron beam columns to inspect a portion of the object at a same time as another at least one of the electron beam columns is caused to inspect another portion of the object.

19. The apparatus of claim 15, further comprising a non-transitory computer program product comprising machine-readable instructions configured to cause relative movement between the object and the electron beam columns for inspection or measurement such that, during the inspection or measurement, a span in all directions of a combined field of view of the plurality of electron beams of a respective electron beam column is less than the span in all directions of the field or die being inspected by those electron beams of the respective electron beam column.

20. The apparatus of claim 15, wherein the electron beams of each column are arranged in a two-dimensional array.

* * * * *